US012550584B2

(12) United States Patent
Kim et al.

(10) Patent No.: US 12,550,584 B2
(45) Date of Patent: Feb. 10, 2026

(54) DISPLAY DEVICE AND MANUFACTURING METHOD OF THE SAME

(71) Applicant: Samsung Display Co., Ltd., Yongin-Si (KR)

(72) Inventors: Jae Ik Kim, Yongin-si (KR); Hye Jin Gwark, Yongin-si (KR); Hwi Kim, Yongin-si (KR); Jung Sun Park, Yongin-si (KR); Yeon Hwa Lee, Yongin-si (KR); Joon Gu Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 371 days.

(21) Appl. No.: 18/231,787

(22) Filed: Aug. 9, 2023

(65) Prior Publication Data

US 2024/0164177 A1 May 16, 2024

(30) Foreign Application Priority Data

Nov. 16, 2022 (KR) .......................... 10-2022-0153217

(51) Int. Cl.
| | |
|---|---|
| *H10K 59/80* | (2023.01) |
| *H10K 59/00* | (2023.01) |
| *H10K 59/12* | (2023.01) |
| *H10K 59/122* | (2023.01) |

(52) U.S. Cl.
CPC ... *H10K 59/80516* (2023.02); *H10K 59/1201* (2023.02); *H10K 59/122* (2023.02); *H10K 59/771* (2023.02)

(58) Field of Classification Search
CPC ......... H10K 59/80516; H10K 59/1201; H10K 59/122; H10K 59/771; H10K 59/123; H10K 50/15; H10K 50/171; H10K 50/805; H10K 59/805; H10K 71/60; H10K 71/621;
(Continued)

(56) References Cited

U.S. PATENT DOCUMENTS 11,088,339 B2 * 8/2021 Kim ...................... H10K 59/123
11,997,906 B2 * 5/2024 Lee ......................... H10K 59/38
(Continued)

FOREIGN PATENT DOCUMENTS

| JP | 2011-034931 A | 2/2011 |
|---|---|---|
| KR | 10-2019-0062853 A | 6/2019 |
| KR | 10-2178471 B1 | 11/2020 |

*Primary Examiner* — Kevin Quarterman
(74) *Attorney, Agent, or Firm* — Innovation Counsel LLP

(57) ABSTRACT

A display device includes a pixel electrode, a pixel defining layer including an opening extending to a portion of the pixel electrode, a first auxiliary electrode on the portion of the pixel electrode to which the opening extends, a second auxiliary electrode on the first auxiliary electrode, an intermediate layer on the pixel defining layer and the second auxiliary electrode, and a common electrode on the intermediate layer. A side surface of the first auxiliary electrode is positioned inward of a side surface of the second auxiliary electrode within the opening of the pixel defining layer to form an undercut shape. A hole injection layer of the intermediate layer includes a first portion on a side surface of the pixel defining layer defining the opening of the pixel defining layer, and a second portion disconnected from the first portion and on the second auxiliary electrode.

20 Claims, 14 Drawing Sheets

(58) Field of Classification Search
CPC .... H10K 50/814; H10K 50/125; H10K 50/16; H10K 50/17; H10K 50/822; H10K 71/00
See application file for complete search history.

(56) References Cited

U.S. PATENT DOCUMENTS 12,349,549 B2 * 7/2025 Shin .................... H10K 59/122
2019/0280063 A1 9/2019 Lee

* cited by examiner

DISPLAY DEVICE AND MANUFACTURING METHOD OF THE SAME

CROSS-REFERENCE TO RELATED APPLICATION

This application claims priority from Korean Patent Application No. 10-2022-0153217 filed on Nov. 16, 2022, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device and a manufacturing method of the same.

2. Description of the Related Art

The importance of a display device is increasing with the development of multimedia. Accordingly, various types of display devices such as an organic light emitting display (OLED) and a liquid crystal display (LCD) are being used.

The organic light emitting display includes two electrodes and an organic light-emitting layer disposed between the two electrodes. In the organic light emitting display, electrons injected from one electrode and holes injected from the other electrode are combined in the organic light-emitting layer to form excitons, and the excitons emit light while emitting energy.

Such an organic light emitting display includes a plurality of pixels including an organic light emitting diode (OLED), which is a self light emitting element, and a plurality of thin film transistors and one or more capacitors for driving the organic light emitting diode. The thin film transistor generates a driving current, but there is a problem in that a leakage current affecting driving of adjacent pixels may also occur.

SUMMARY

Aspects of the present disclosure provide a display device capable of reducing an occurrence of a leakage current that affects driving of adjacent pixels.

Aspects of the present disclosure also provide a manufacturing method of a display device in which an occurrence of leakage current affecting driving of adjacent pixels is reduced.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a display device comprises a pixel electrode, a pixel defining layer, a first auxiliary electrode, a second auxiliary electrode, an intermediate layer, and a common electrode. The pixel electrode is disposed on a substrate. The pixel defining layer is disposed on the pixel electrode and includes an opening extending to a portion of the pixel electrode. The first auxiliary electrode is disposed on the portion of the pixel electrode to which the opening of the pixel defining layer extends. The second auxiliary electrode is disposed on the first auxiliary electrode. The intermediate layer is disposed on the pixel defining layer and the second auxiliary electrode. The common electrode is disposed on the intermediate layer. The intermediate layer includes a hole injection layer, a light-emitting layer, and an electron injection layer that are sequentially stacked. A side surface of the first auxiliary electrode is positioned inward of a side surface of the second auxiliary electrode within the opening of the pixel defining layer to form an undercut shape. The hole injection layer of the intermediate layer includes a first portion disposed on a side surface of the pixel defining layer defining the opening of the pixel defining layer, and a second portion disconnected from the first portion and disposed on the second auxiliary electrode.

In an embodiment, the intermediate layer further includes a hole transport layer disposed between the light-emitting layer and the hole injection layer. The hole transport layer integrally extends to cover the side surface of the pixel defining layer defining the opening of the pixel defining layer and the second auxiliary electrode.

In an embodiment, the intermediate layer further includes an electron transport layer disposed between the light-emitting layer and the electron injection layer. The electron transport layer and the electron injection layer integrally extend to cover the side surface of the pixel defining layer defining the opening of the pixel defining layer and the second auxiliary electrode.

In an embodiment, the hole injection layer includes NDP-9.

In an embodiment, the first auxiliary electrode covers a portion of a portion of the pixel electrode to which the opening of the pixel defining layer extends, and the second auxiliary electrode is spaced apart from the pixel electrode with the first auxiliary electrode interposed between the second auxiliary electrode and the pixel electrode.

In an embodiment, an undercut space defined by a bottom surface of the second auxiliary electrode and the side surface of the first auxiliary electrode is disposed on a top surface of the pixel electrode.

In an embodiment, the first portion of the hole injection layer is not in contact with the pixel electrode.

In an embodiment, the first auxiliary electrode and the second auxiliary electrode integrally extend to cover an entirety of the portion of the pixel electrode to which the opening of the pixel defining layer extends and a portion of the side surface of the pixel defining layer defining the opening of the pixel defining layer.

In an embodiment, an undercut space defined by a bottom surface of the second auxiliary electrode and the side surface of the first auxiliary electrode is disposed on the side surface of the pixel defining layer defining the opening of the pixel defining layer.

In an embodiment, the first portion of the hole injection layer is not in contact with the side surface of the first auxiliary electrode.

In an embodiment, the display device further comprises a third auxiliary electrode disposed between the first auxiliary electrode and the pixel electrode. A side surface of the third auxiliary electrode is positioned outward of the side surface of the first auxiliary electrode within the opening of the pixel defining layer.

In an embodiment, an undercut space defined by a bottom surface of the second auxiliary electrode and the side surface of the first auxiliary electrode is disposed on a top surface of the third auxiliary electrode.

According to an aspect of the present disclosure, a display device comprises a pixel electrode layer, a pixel defining layer, an intermediate layer, a first auxiliary electrode, a second auxiliary electrode, and a common electrode. The pixel electrode layer includes a first pixel electrode, a second pixel electrode, and a third pixel electrode disposed to be spaced apart from each other on a substrate. The pixel defining layer is disposed on the pixel electrode layer and includes a first opening extending to a portion of the first pixel electrode, a second opening extending to a portion of the second pixel electrode, and a third opening extending to a portion of the third pixel electrode. The intermediate layer is disposed on the pixel defining layer and extends to cover the first opening, the second opening, and the third opening of the pixel defining layer. The first auxiliary electrode and the second auxiliary electrode are disposed between the intermediate layer and at least one of the first pixel electrode, the second pixel electrode, and the third pixel electrode and are sequentially stacked. The common electrode is disposed on the intermediate layer and extends to cover the first opening, the second opening, and the third opening of the pixel defining layer. The intermediate layer includes a hole injection layer, a light-emitting layer, and an electron injection layer that are sequentially stacked. A side surface of the first auxiliary electrode is positioned inward of a side surface of the second auxiliary electrode within at least one of the first opening, the second opening, and the third opening of the pixel defining layer to form an undercut shape. The hole injection layer of the intermediate layer includes a first portion disposed on a side surface of the pixel defining layer defining each opening of the pixel defining layer, and a second portion disconnected from the first portion and disposed on the second auxiliary electrode.

In an embodiment, the intermediate layer further includes a hole transport layer disposed between the hole injection layer and the light-emitting layer, and an electron transport layer disposed between the light-emitting layer and the electron injection layer. The hole transport layer, the electron transport layer, and the electron injection layer each integrally extend and overlap the first pixel electrode, the second pixel electrode, and the third pixel electrode.

In an embodiment, the light-emitting layer includes a first light-emitting layer overlapping the first pixel electrode, a second light-emitting layer overlapping the second pixel electrode, and a third light-emitting layer overlapping the third pixel electrode. The first light-emitting layer, the second light-emitting layer, and the third light-emitting layer are disposed to be spaced apart from each other.

In an embodiment, the first auxiliary electrode and the second auxiliary electrode are disposed on the first pixel electrode and the second pixel electrode and are not disposed on the third pixel electrode.

In an embodiment, a third auxiliary electrode is disposed between the first auxiliary electrode disposed on the first pixel electrode and the first pixel electrode. A side surface of the third auxiliary electrode is positioned outward of the side surface of the first auxiliary electrode disposed on the first pixel electrode within the first opening of the pixel defining layer, and the first light-emitting layer emits red light.

In an embodiment, the first auxiliary electrode disposed on the second pixel electrode is disposed directly above the second pixel electrode, and the second light-emitting layer emits green light.

In an embodiment, the first portion of the hole injection layer disposed on the side surface of the pixel defining layer defining the third opening of the pixel defining layer integrally extends to cover a top surface of the third pixel electrode, and the third light-emitting layer emits blue light.

According to an aspect of the present disclosure, a manufacturing method of a display device comprises forming a pixel electrode on a substrate. A pixel defining layer including an opening extending to a portion of the pixel electrode on the pixel electrode is formed. A first auxiliary electrode layer and a second auxiliary electrode layer disposed on the pixel defining layer and extending to cover the opening of the pixel defining layer are sequentially formed. A photoresist layer on a portion of the second auxiliary electrode layer overlapping a portion of the pixel electrode to which the opening of the pixel defining layer extends is formed. A second auxiliary electrode is formed by etching a portion of the second auxiliary electrode layer that does not overlap the photoresist layer. A first auxiliary electrode is formed by etching a portion of the first auxiliary electrode layer that does not overlap the photoresist layer. An undercut shape in which a side surface of the first auxiliary electrode is positioned inward of a side surface of the second auxiliary electrode within the opening of the pixel defining layer is formed by etching the side surface of the first auxiliary electrode. A hole injection layer including a first portion disposed on a side surface of the pixel defining layer defining the opening of the pixel defining layer and a second portion disconnected from the first portion and disposed on the second auxiliary electrode is formed.

In the display device according to an embodiment, an occurrence of leakage current affecting driving of adjacent pixels may be reduced.

The manufacturing method of a display device according to an embodiment may provide a display device in which an occurrence of leakage current affecting driving of adjacent pixels is reduced.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the present disclosure will become more apparent by describing in detail embodiments thereof with reference to the attached drawings.

DETAILED DESCRIPTION OF THE EMBODIMENTS

The inventive concept will now be described more fully hereinafter with reference to the accompanying drawings, in which embodiments are shown. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the inventive concept. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments will be described with reference to the accompanying drawings.

Figure 1:
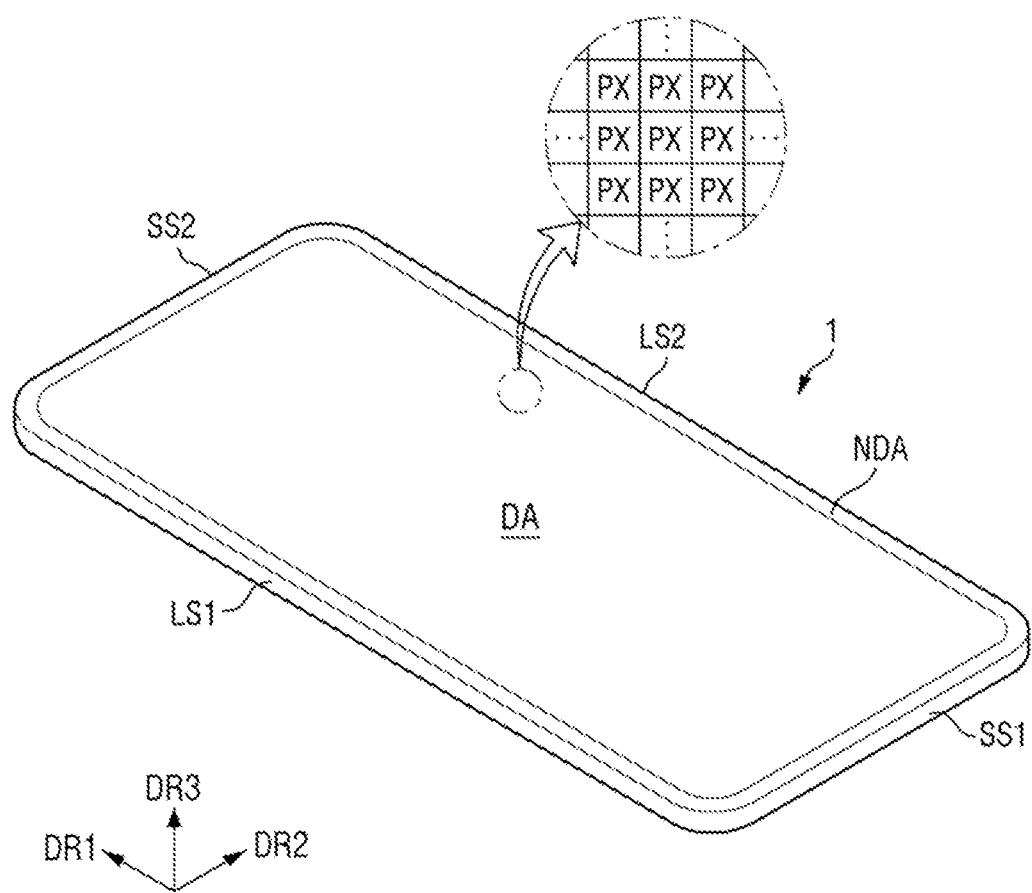
FIG. 1 is a perspective view of a display device according to an embodiment.

FIG. 1 is a perspective view of a display device 1 according to an embodiment.

In FIG. 1, a first direction DR1, a second direction DR2, and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 means a horizontal direction in the drawings, the second direction DR2 means a vertical direction in the drawings, and the third direction DR3 means upper and lower directions in the drawings, that is, a thickness direction. In the following specification, unless otherwise specified, the term "direction" may refer to both directions toward both sides extending along the direction. In addition, when both "directions" extending to both sides need to be distinguished from each other, one side will be referred to as "one side in the direction" and the other side will be referred to as "the other side in the direction". In FIG. 1, a direction in which an arrow indicating a direction is directed is referred to as one side, and an opposite direction thereof is referred to as the other side. However, it should be understood that the directions mentioned in the embodiments refer to relative directions.

Hereinafter, for convenience of explanation, in referring to surfaces of the display device 1 or each member constituting the display device 1, one surface facing one side in a direction in which an image is displayed, that is, in the third direction DR3 is referred to as a top surface, and an opposite surface of the one surface is referred to as a bottom surface. However, in an embodiment, the one surface and the other surface of the member may be referred to as a front surface and a rear surface, respectively, or may also be referred to as a first surface or a second surface. In addition, in describing a relative position of each member of the display device 1, one side in the third direction DR3 may be referred to as an upper side and the other side in the third direction DR3 may be referred to as a lower side.

The display device 1 may refer to any electronic device that provides a display screen. For example, the display device may include mobile phones, smart phones, tablet personal computers (PCs), electronic watches, smart watches, watch phones, mobile communication terminals, electronic notebooks, e-books, portable multimedia players (PMPs), navigation devices, game machines, digital cameras, televisions, laptop computers, netbooks, monitors, billboards, Internet of Things, and the like that provide the display screen. The present embodiment illustrates an example in which the display device 1 is applied to a medium-sized portable device such as a tablet PC.

A particular planar shape of the display device 1 is illustrated. However, in an embodiment, the planar shape of the display device 1 may be variously modified according to a field to which the display device 1 is applied, such as a rectangle, a square, a rhombus, other polygons, a circle, and an ellipse. The planar shape of the illustrated display device 1 is a rectangle with rounded corners, and long sides LS1 and LS2 are positioned parallel to the first direction DR1. For convenience of explanation, a long side positioned on one side, e.g., left side of a plane in the drawing, of two long sides opposing each other of the rectangle is referred to as a first long side LS1, and a long side positioned on the other side, e.g., right side of a plane in the drawing, of the two long sides opposing each other of the rectangle is referred to as a second long side LS2. In addition, a short side positioned on one side, e.g., lower side on a plane in the drawing, of two short sides opposing each other is referred to as a first short side SS1, and a short side positioned on the other side, e.g., upper side on a plane in the drawing, of the two short sides opposing each other is referred to as a second short side SS2. The terms of the first long side LS1, the second long side LS2, the first short side SS1, and the second short side SS2 will be used interchangeably to refer to the corresponding sides even when the display device 1 as well as components included in the display device 1 have similar shapes and positional relationships.

The display device 1 includes a display area DA and a non-display area NDA. The display area DA is an area in which a screen is displayed, and the non-display area NDA is an area in which a screen is not displayed. The terms of the display area DA and the non-display area NDA will be used interchangeably to refer to the corresponding areas even when the display device 1 as well as components included in the display device 1 have similar shapes and positional relationships.

A plurality of pixels PX may be disposed in the display area DA. A structure of the plurality of pixels PX will be described later.

The non-display area NDA may be disposed around the display area DA. When the display area DA has a rectangular shape, the non-display area NDA may be disposed to surround four sides of the display area DA. However, in an embodiment, the non-display area NDA may also be disposed outside only some sides of the display area DA. In some cases, the non-display area NDA may exist inside the display area DA, and the non-display area NDA may also be surrounded by the display area DA.

Figure 2:
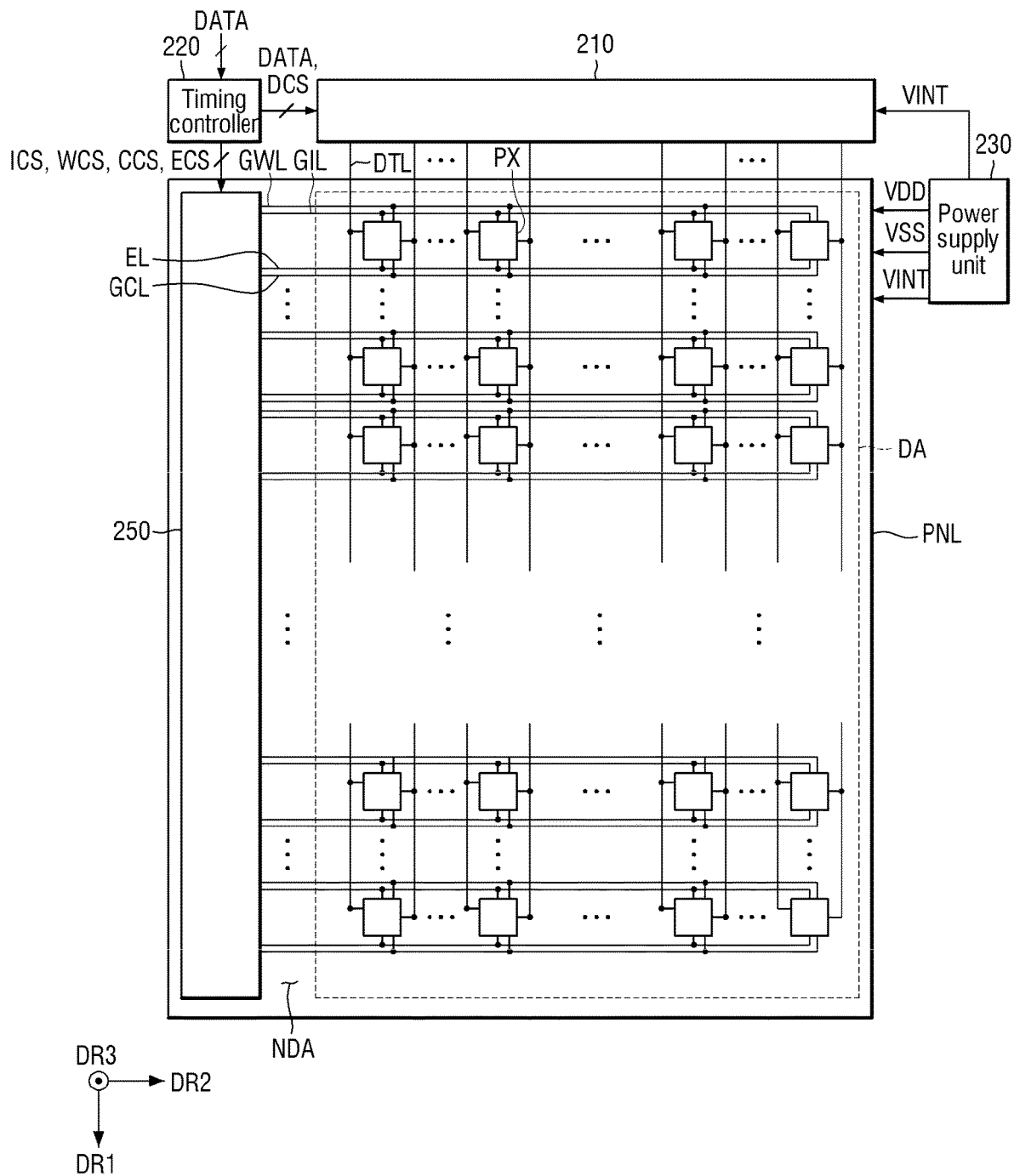
FIG. 2 is a schematic block diagram of a display device according to an embodiment.

FIG. 2 is a schematic block diagram of a display device according to an embodiment.

Referring to FIGS. 1 and 2, the display device 1 includes a display panel PNL. The display device 1 may further include a driving unit connected to the display panel PNL.

In the present specification, the meaning of 'connection' may mean that a member is not only connected to another member through mutual physical contact, but also connected to another member through other members. In addition, it may be understood that any one portion and another portion as one integrated member are interconnected due to the integrated member. Furthermore, the connection between any one member and another member may be interpreted as the meaning including an electrical connection through the other member in addition to a connection through direct contact therebetween.

The display panel PNL provides a display screen. In the illustrated display device 1, a direction in which the display panel PNL provides the display screen is one side in the third direction DR3. The display panel PNL may have a substantially similar planar shape to that of the display device 1. As described above, the display area DA of the display device 1 may also be referred to as a display area DA of the display panel PNL. The display area DA of the display panel PNL includes a plurality of pixels PX arranged in a matrix shape.

Examples of the display panel PNL may include an organic light emitting display panel, a micro LED display panel, a nano LED display panel, a quantum dot light emitting display panel, a liquid crystal display panel, a plasma display panel, a field emission display panel, an electrophoretic display panel, and an electrowetting display panel. Hereinafter, a case where the organic light emitting display panel is applied as an example of the display panel will be described by way of example, but the present disclosure may be applied to other display panels as long as the same technical concept is applicable.

The driving unit drives an operation of the display panel PNL. At least some elements of the driving drive the plurality of pixels PX disposed in the display area DA of the display panel PNL. In some embodiments, the driving unit may be provided in the form of a chip, film, and/or circuit board.

The driving unit may include a display scan driving unit 250, a data driving unit 210, a timing controller 220, and a power supply unit 230. Although the driving unit is positioned in the non-display area NDA of the display panel PNL, some driving units may also be disposed within the display area DA.

In the display area DA, not only the pixels PX but also a plurality of lines connected to the driving unit are disposed. The plurality of lines may include a plurality of display write lines GWL, a plurality of display initialization lines GIL, a plurality of display control lines GCL, a plurality of light emitting lines EL, and a plurality of data lines DTL.

The data line DTL may extend in the first direction DR1. The display write line GWL, the display initialization line GIL, the display control line GCL, and the light emitting line EL may extend in the second direction DR2.

Each of the pixels PX may be connected to any one of the plurality of display write lines GWL, any one of the plurality of display initialization lines GIL, any one of the plurality of display control lines GCL, and any one of the plurality of light emitting lines EL. Each of the pixels PX may receive a data voltage of the data line DTL according to a display write signal of the display write line GWL, a display initialization signal of the display initialization line GIL, a display control signal of the display control line GCL, and a light emitting signal of the light emitting line EL, and may supply a driving current to a light emitting element according to the data voltage to emit light.

The display scan driving unit 250 may be connected to the display write line GWL, the display initialization line GIL, the display control line GCL, and the light emitting line EL. The display scan driving unit 250 may include a display signal output unit that outputs display write signals applied to the display write line GWL, display initialization signals applied to the display initialization line GIL, and display control signals applied to the display control line GCL, and a light emitting signal output unit that outputs light emitting signals applied to the light emitting line EL.

The display scan driving unit 250 may receive a write control signal WCS, an initialization control signal ICS, a scan control signal CCS, and a light emitting control signal ECS from the timing controller 220. The display signal output unit of the display scan driving unit 250 may generate display write signals according to the write control signal WCS and output the display write signals to the display write line GWL. In addition, the display signal output unit of the display scan driving unit 250 may generate display initialization signals according to the initialization control signal ICS and output the display initialization signals to the display initialization line GIL. In addition, the display signal output unit of the display scan driving unit 250 may generate display control signals according to the scan control signal CCS and output the display control signals to the display control line GCL. Furthermore, the display signal output unit of the display scan driving unit 250 may generate display light emitting signals according to the light emitting control signal ECS and output the display light emitting signals to the display light emitting line EL.

The data driving unit 210 converts digital video data DATA into data voltages and outputs the data voltages to the data line DTL. The data driving unit 210 may output the data voltages in synchronization with the display write signals. The pixels PX may be selected by the display write signals of the display scan driving unit 250, and the data voltage may be supplied to each of the selected pixels PX.

The timing controller 220 receives digital video data DATA and timing signals from an external graphic device. For example, the external graphic device may be a graphic card of a computer or a set top box.

The timing controller 220 may generate the write control signal WCS, the initialization control signal ICS, the scan control signal CCS, and the light emitting control signal ECS for controlling an operation timing of the display scan driving unit 250 according to timing signals. In addition, the timing controller 220 may generate a data control signal DCS for controlling the operation timing of the data driving unit 210 according to the timing signals.

The timing controller 220 may output the write control signal WCS, the initialization control signal ICS, the scan control signal CCS, and the light emitting control signal ECS to the display scan driving unit 250. The timing controller 220 outputs the digital video data DATA and the data control signal DCS to the data driving unit 210.

The power supply unit 230 may generate a plurality of driving voltages and output the plurality of driving voltages to the display area DA. The power supply unit 230 may output a first driving voltage VDD, a second driving voltage VSS, and a third driving voltage VINT to the display panel PNL. The first driving voltage VDD may be a high potential driving voltage, the second driving voltage VSS may be a low potential driving voltage, and the third driving voltage VINT may be a voltage for initializing a gate electrode of a driving transistor of each of the pixels PX.

Figure 3:
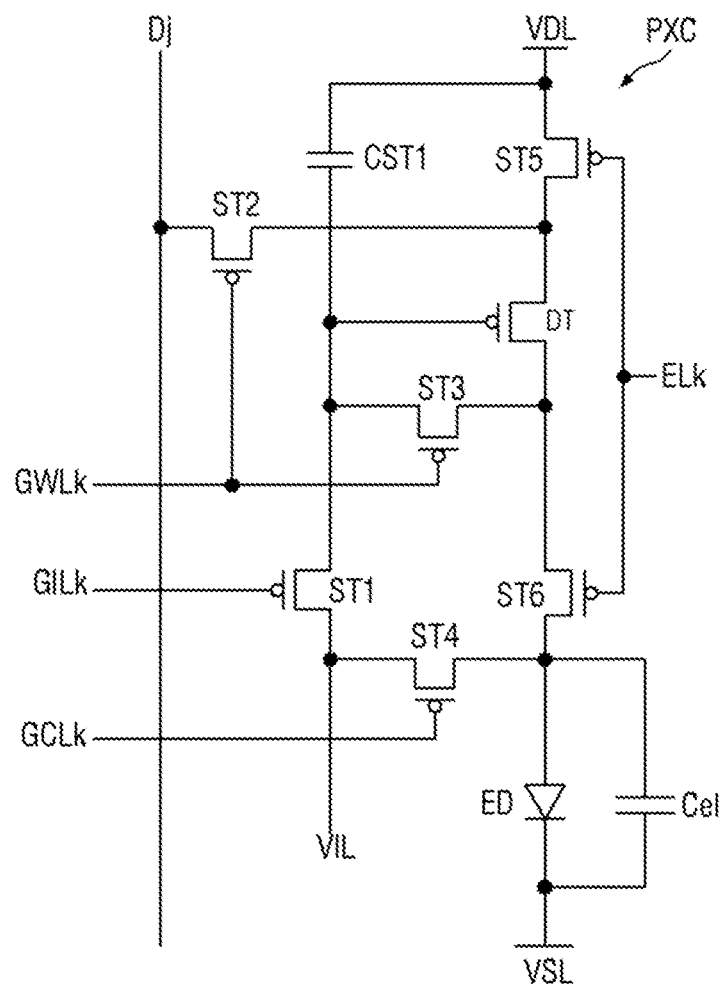
FIG. 3 is an equivalent circuit diagram of a pixel of the display device according to an embodiment.

FIG. 3 is an equivalent circuit diagram of a pixel of the display device according to an embodiment.

Referring to FIG. 3, a pixel PX according to an embodiment may be connected to a k-th, where k is a positive integer, display initialization line GILk, a k-th display write line GWLk, and a k-th display control line GCLk. In addition, the pixel PX may be connected to a first driving voltage line VDL supplied with the first driving voltage, a second driving voltage line VSL supplied with the second driving voltage, and a third driving voltage line VIL supplied with the third driving voltage.

A pixel circuit PXC may include a driving transistor DT, switch elements, and a capacitor CST1. The switch elements include first to sixth transistors ST1, ST2, ST3, ST4, ST5, and ST6.

The driving transistor DT may include a gate electrode, a first electrode, and a second electrode. The driving transistor DT controls a drain-source current Ids, hereinafter, referred to as a "driving current", flowing between the first electrode and the second electrode according to a data voltage applied to the gate electrode thereof. The driving current Ids flowing through a channel of the driving transistor DT is proportional to a square of a difference between a voltage Vsg between the first electrode and the gate electrode of the driving transistor DT and a threshold voltage thereof as in Equation 1.

$$Ids = k' \times (Vsg - Vth)^2 \qquad \text{[Equation 1]}$$

In Equation 1, k' is a proportional coefficient determined by a structure and physical characteristics of the driving transistor, Vsg is a voltage between the first electrode and the gate electrode of the driving transistor, and Vth is a threshold voltage of the driving transistor DT.

A light emitting element ED emits light according to the driving current Ids. As the driving current Ids increases, an amount of light emitted from the light emitting element ED may increase.

The light emitting element ED may be an organic light emitting diode including an organic light-emitting layer disposed between an anode electrode and a cathode electrode. Alternatively, the light emitting element ED may be an inorganic light emitting element including an inorganic semiconductor disposed between the anode electrode and the cathode electrode. Alternatively, the light emitting element ED may be a quantum dot light emitting element including a quantum dot light-emitting layer disposed between the anode electrode and the cathode electrode. Alternatively, the light emitting element ED may be a micro light emitting element including a micro light emitting diode disposed between the anode electrode and the cathode electrode. Hereinafter, it will be mainly described that the light emitting element ED is the organic light emitting diode including the organic light-emitting layer disposed between the anode electrode and the cathode electrode.

Meanwhile, in the following specification, the 'anode electrode' of the light emitting element ED may be interchangeably referred to as a 'pixel electrode', and the 'cathode electrode' of the light emitting element ED may be interchangeably referred to as a 'common electrode CE'.

The anode electrode of the light emitting element ED may be connected to a first electrode of the fourth transistor ST4 and a second electrode of the sixth transistor ST6, and the cathode electrode of the light emitting element ED may be connected to the second driving voltage line VSL. A parasitic capacitance Cel may be formed between the anode electrode and the cathode electrode of the light emitting element ED.

The first transistor ST1 is turned on by an initialization scan signal of the k-th display initialization line GILk to connect the gate electrode of the driving transistor DT to the third driving voltage line VIL. Accordingly, the third driving voltage VINT of the third driving voltage line VIL may be applied to the gate electrode of the driving transistor DT. A gate electrode of the first transistor ST1 may be connected to the k-th display initialization line GILk, a first electrode thereof may be connected to the gate electrode of the driving transistor DT, and a second electrode thereof may be connected to the third driving voltage line VIL.

The second transistor ST2 is turned on by a display write signal of the k-th display write line GWLk to connect the first electrode of the driving transistor DT to a j-th data line Dj. Accordingly, a data voltage of the j-th data line Dj may be applied to the first electrode of the driving transistor DT. A gate electrode of the second transistor ST2 may be connected to the k-th display write line GWLk, a first electrode thereof may be connected to the first electrode of the driving transistor DT, and a second electrode thereof may be connected to the j-th data line Dj.

The third transistor ST3 is turned on by the display write signal of the k-th display write line GWLk to connect the gate electrode and the second electrode of the driving transistor DT to each other. When the gate electrode and the second electrode of the driving transistor DT are connected to each other, the driving transistor DT is driven as a diode. A gate electrode of the third transistor ST3 may be connected to the k-th display write line GWLk, a first electrode thereof may be connected to the second electrode of the driving transistor DT, and a second electrode thereof may be the gate electrode of the driving transistor DT.

The fourth transistor ST4 is turned on by a display control signal of the k-th display control line GCLk to connect the anode electrode of the light emitting element ED to the third driving voltage line VIL. The third driving voltage of the third driving voltage line VIL may be applied to the anode electrode of the light emitting element ED. A gate electrode of the fourth transistor ST4 is connected to the k-th display control line GCLk, a first electrode thereof is connected to the anode electrode of the light emitting element ED, and a second electrode thereof may be connected to the third driving voltage line VIL.

The fifth transistor ST5 is turned on by a light emitting signal of a k-th light emitting line ELk to connect the first electrode of the driving transistor DT to the first driving voltage line VDL. A gate electrode of the fifth transistor ST5 is connected to the k-th light emitting line ELk, a first electrode thereof is connected to the first driving voltage line VDL, and a second electrode thereof is connected to the first electrode of the driving transistor DT.

The sixth transistor ST6 is disposed between the second electrode of the driving transistor DT and the anode electrode of the light emitting element ED. The sixth transistor ST6 is turned on by the light emitting control signal of the k-th light emitting line ELk to connect the second electrode of the driving transistor DT to the anode electrode of the light emitting element ED. A gate electrode of the sixth transistor ST6 is connected to the k-th light emitting line ELk, a first electrode thereof is connected to the second electrode of the driving transistor DT, and a second electrode thereof is connected to the anode electrode of the light emitting element ED.

When both the fifth transistor ST5 and the sixth transistor ST6 are turned on, the driving current Ids of the driving transistor DT according to the data voltage applied to the gate electrode of the driving transistor DT may flow to the light emitting element ED.

The capacitor CST1 is formed between the gate electrode of the driving transistor DT and the first driving voltage line VDL. A first capacitor electrode of the capacitor CST1 may be connected to the gate electrode of the driving transistor DT, and a second capacitor electrode thereof may be connected to the first driving voltage line VDL.

When the first electrode of each of the first to sixth transistors ST1, ST2, ST3, ST4, ST5, and ST6 and the driving transistor DT is a source electrode, the second electrode thereof may be a drain electrode. Alternatively, when the first electrode of each of the first to sixth transistors ST1, ST2, ST3, ST4, ST5, and ST6 and the driving transistor DT is a drain electrode, the second electrode thereof may be a source electrode. The names of the source electrode and the drain electrode may vary depending on a movement direction of a majority carrier in a semiconductor layer. The first and second electrodes of the first to sixth transistors ST1, ST2, ST3, ST4, ST5, and ST6 and the driving transistor DT may be referred to as source/drain electrodes. If the first electrode and the second electrode are to be separately distinguished, the first electrode and the second electrode may be referred to as a first source/drain electrode and a second source/drain electrode.

An active layer of each of the first to sixth transistors ST1, ST2, ST3, ST4, ST5, and ST6 and the driving transistor DT may be formed of any one of poly silicon, amorphous silicon, and an oxide semiconductor. It is mainly described in FIG. 4 that the first to sixth transistors ST1, ST2, ST3, ST4, ST5, and ST6 and the driving transistor DT are formed as P-type metal oxide semiconductor field effect transistors (MOSFETs). However, in an embodiment, the first to sixth transistors ST1, ST2, ST3, ST4, ST5, and ST6 and the driving transistor DT may be formed as N-type MOSFETs. Alternatively, at least one of the first to sixth transistors ST1, ST2, ST3, ST4, ST5, and ST6 and the driving transistor DT may be formed as an N-type MOSFET.

Although it is described in the embodiment described above that the pixel circuit PXC adopts a 7T1C structure including seven transistors and one capacitor, the number of transistors and capacitors constituting the pixel circuit PXC may be variously modified.

Figure 4:
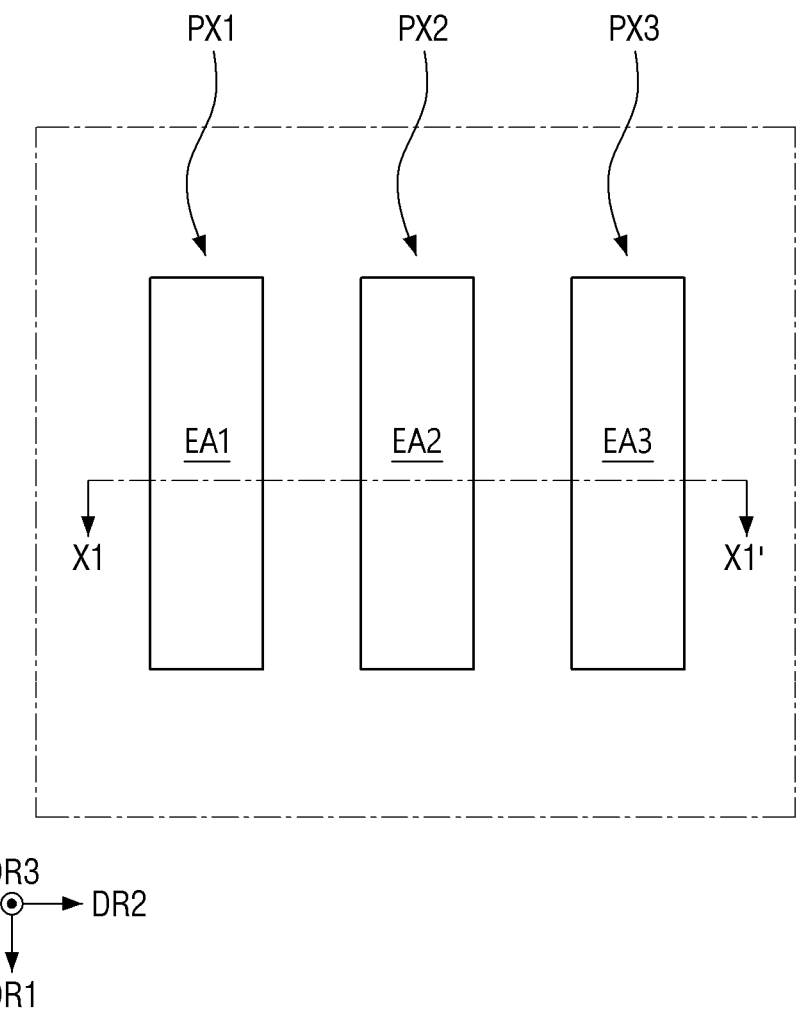
FIG. 4 is a plan view illustrating a structure of pixels of the display device according to an embodiment.

FIG. 4 is a plan view illustrating a structure of pixels of the display device according to an embodiment.

Referring to FIG. 4, the plurality of pixels PX may be disposed in a group. For example, the plurality of pixels PX may be disposed as a group including three pixels. Although it is illustrated in FIG. 4 that the plurality of pixels PX includes a first pixel PX1, a second pixel PX2, and a third pixel PX3, and the first pixel PX1, the second pixel PX2, and the third pixel PX3 form one group, the number of pixels PX forming a group is varied in an embodiment.

Each of the first pixel PX1, the second pixel PX2, and the third pixel PX3 may have a rectangular, square, or rhombus planar shape. In some embodiments, each of the first pixel PX1, the second pixel PX2, and the third pixel PX3 may have a rectangular planar shape having long sides in the first direction DR1 and short sides in the second direction DR2 as illustrated in FIG. 4. However, in an embodiment, each of the first pixel PX1, the second pixel PX2, and the third pixel PX3 may also have a square or rhombus planar shape including sides having the same length in the first direction DR1 and the second direction DR2.

In some embodiments, the first pixel PX1, the second pixel PX2, and the third pixel PX3 may be arranged in the second direction DR2 as illustrated in FIG. 4. However, in an embodiment, any one of the second pixel PX2 and the third pixel PX3 and the first pixel PX1 may be arranged in the second direction DR2, and the other one of the second pixel PX2 and the third pixel PX3 and the first pixel PX1 may be arranged in the first direction DR1.

The first pixel PX1 includes a first light emitting area EA1 emitting first light, the second pixel PX2 includes a second light emitting area EA2 emitting second light, and the third pixel PX3 includes a third light emitting area EA3 emitting third light. In this case, the first light may be light in a red wavelength band, the second light may be light in a green wavelength band, and the third light may be light in a blue wavelength band. The red wavelength band may be a wavelength band of approximately 600 nm to 750 nm, the green wavelength band may be a wavelength band of approximately 480 nm to 560 nm, and the blue wavelength band may be a wavelength band of approximately 370 nm to 460 nm.

As illustrated in FIG. 4, an area of the first pixel PX1, an area of the second pixel PX2, and an area of the third pixel PX3 may be substantially the same. However, in an embodiment, the area of the first pixel PX1, the area of the second pixel PX2, and the area of the third pixel PX3 may also be different from each other.

Figure 5:
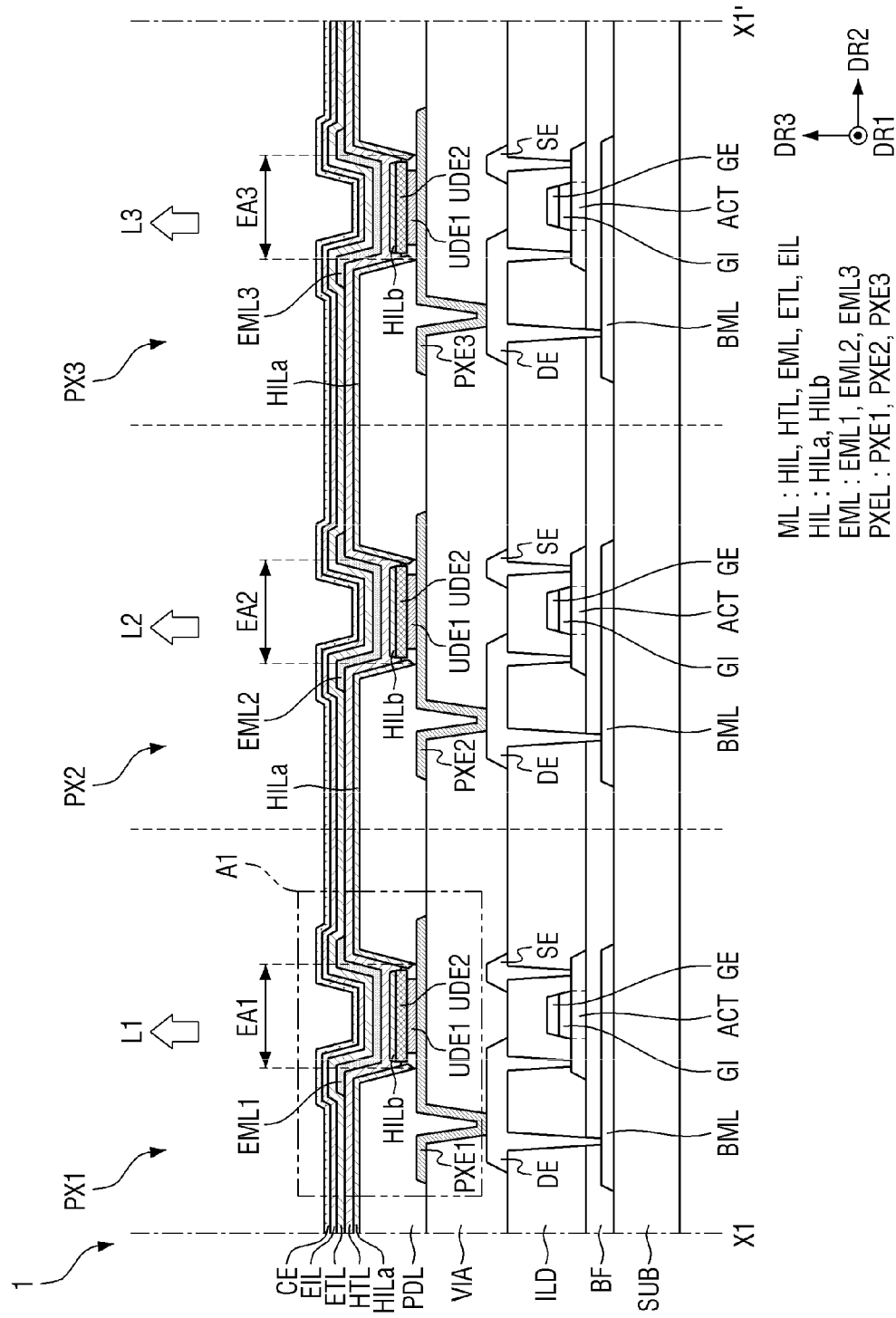
FIG. 5 is a cross-sectional view schematically illustrating a cross section taken along line X1-X1' of FIG. 4.

FIG. 5 is a cross-sectional view schematically illustrating a cross section taken along line X1-X1' of FIG. 4.

FIG. 5 illustrates structures of a first pixel PX1 emitting first light L1, a second pixel PX2 emitting second light L2, and a third pixel PX3 emitting third light L3 as pixels PX adjacent to each other.

In addition, FIG. 5 illustrates a shape of one thin film transistor among the plurality of transistors described in FIG. 3 and a connection relationship thereof for convenience of explanation. The illustrated thin film transistor may correspond to, for example, the driving transistor DT of FIG. 3. However, the connection relationship of the illustrated thin film transistors is illustrated for convenience of possible connection relationships of the applied thin film transistors, and a specific connection relationship does not exactly correspond to the driving transistor illustrated in FIG. 3. Except for the connection relationship between the thin film transistors, other transistors of FIG. 3 may also have substantially the same stacked structure as the thin film transistor illustrated in FIG. 5.

Hereinafter, a structure of the pixels PX of the display device 1 according to an embodiment will be described with reference to FIG. 5.

A substrate SUB may be an insulating substrate or a semiconductor substrate. The substrate SUB may be a rigid substrate. For example, the substrate SUB may include glass.

A lower metal layer BML may be disposed on the substrate SUB. The lower metal layer BML may have a patterned shape, and may overlap a semiconductor layer ACT thereon to function as a light-blocking metal layer preventing light entering from a lower side thereof from being incident on the semiconductor layer ACT. The lower metal layer BML may be electrically connected to one electrode of the thin film transistor, for example, a drain electrode DE. The lower metal layer BML may also be omitted.

A buffer layer BF is disposed on the lower metal layer BML. The buffer layer BF may be formed over a front surface of the substrate SUB. The buffer layer BF serves to insulate the semiconductor layer ACT and the lower metal layer BML from each other. The buffer layer BF may include silicon nitride, silicon oxide, or silicon oxynitride.

The semiconductor layer ACT is disposed on the buffer layer BF. The semiconductor layer ACT may overlap the lower metal layer BML in the third direction DR3 that is the thickness direction as described above. The semiconductor layer ACT may include a first region, a second region, and a channel region disposed between the first region and the second region. The first region may be a source region and the second region may be a drain region, or vice versa.

The semiconductor layer ACT may include polycrystalline silicon. In an embodiment, the semiconductor layer ACT may include single crystal silicon, low temperature polycrystalline silicon, amorphous silicon, or an oxide semiconductor. The oxide semiconductor may include a binary compound (ABx), a ternary compound (ABxCy), and a quaternary compound (ABxCyDz) containing, for example, indium, zinc, gallium, tin, titanium, aluminum, hafnium (Hf), zirconium (Zr), magnesium (Mg), and the like. In an embodiment, the semiconductor layer ACT may include ITZO (oxide including indium, tin, and titanium) or IGZO (oxide including indium, gallium, and tin).

A gate insulating layer GI is disposed on the semiconductor layer ACT. The gate insulating layer GI may include a silicon compound, a metal oxide, or the like. For example, the gate insulating layer GI may include silicon oxide, silicon nitride, silicon oxynitride, aluminum oxide, tantalum oxide, hafnium oxide, zirconium oxide, titanium oxide, or the like. These oxides may be used alone or in combination with each other. The gate insulating layer GI may be a single film or a multilayer film including stacked films of different materials.

The gate insulating layer GI may be disposed on a partial region of the semiconductor layer ACT. For example, as illustrated in FIG. 5, the gate insulating layer GI may be disposed on the channel region of the semiconductor layer ACT, but may expose the first region and the second region thereof. That is, the gate insulating layer GI may overlap the channel region, but may not overlap the first region and the second region. The gate insulating layer GI may have substantially the same planar shape as that of a gate electrode GE thereon.

As another example, the gate insulating layer GI may also be disposed on an entire surface of the substrate SUB. In this case, the gate insulating layer GI generally covers the first region and the second region of the semiconductor layer ACT, but may have a contact hole exposing the first region and the second region so that a source electrode SE and the drain electrode DE are in contact with the semiconductor layer ACT.

A gate conductive layer is disposed on the gate insulating layer GI. The gate conductive layer includes the gate electrode GE of the thin film transistor. In addition, the gate conductive layer may include a scan line connected to the gate electrode GE. For example, the display write line GWL, the display initialization line GIL, the display control line GCL, and the light emitting line EL illustrated in FIG. 2 may be included in the gate conductive layer.

The gate electrode GE may at least partially overlap the channel region of the semiconductor layer ACT. Accordingly, the gate electrode GE and the semiconductor layer ACT may form a portion of the thin film transistor.

For example, the gate conductive layer may include one or more metals selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). In an embodiment, the gate conductive layer may be formed of a stacked film of Mo/MoN.

An interlayer insulating layer ILD may be disposed on the gate conductive layer. The interlayer insulating layer ILD may include at least one of an inorganic film containing an inorganic insulating material, an organic film containing an organic insulating material, or an organic/inorganic composite film containing an inorganic insulating material and an organic insulating material.

Examples of the organic insulating material may include silicon oxide, silicon nitride, silicon oxynitride, hafnium oxide, aluminum oxide, titanium oxide, tantalum oxide, and zinc oxide, and examples of the organic insulating material may include a polyacrylates resin, an epoxy resin, a phenolic resin, a polyamides resin, a polyimides resin, an unsaturated polyesters resin, a polyphenylenethers resin, a polyphenylenesulfides resin, or benzocyclobutene (BCB).

The interlayer insulating layer ILD may have a structure in which two or more films selected from the group consisting of a plurality of inorganic films, a plurality of organic films, and a plurality of organic/inorganic composite films are stacked. FIG. 5 illustrates an example in which one inorganic film is applied as the interlayer insulating layer ILD.

A data conductive layer is disposed on the interlayer insulating layer ILD. The data conductive layer may include the source electrode SE and the drain electrode DE of the thin film transistor. The data conductive layer may further include the data line DTL illustrated in FIG. 2 and the first driving voltage line VDL. In addition, the data conductive layer may further include the second driving voltage line VSL and the third driving voltage line VIL.

The source electrode SE and the drain electrode DE of the thin film transistor may be electrically connected to the first and second regions of the semiconductor layer ACT through a contact hole penetrating through the interlayer insulating layer ILD. In addition, the drain electrode DE of the thin film transistor may be electrically connected to the lower metal layer BML through a contact hole penetrating through the interlayer insulating layer ILD and the buffer layer BF.

The data conductive layer may include one or more metals selected from the group consisting of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu).

The data conductive layer may be formed of a multilayer film. Specifically, the data conductive layer includes a main conductive layer and may further include sub-conductive layers disposed on upper and/or lower sides of the main conductive layer. For example, the data conductive layer may include a first sub-conductive layer, a main conductive layer disposed on the first sub-conductive layer, and a second sub-conductive layer disposed on the main conductive layer. The first sub-conductive layer may be a lower sub-conductive layer disposed on a bottom surface of the main conductive layer, and the second sub-conductive layer may be an upper sub-conductive layer disposed on a top surface of the main conductive layer.

Although not illustrated, another conductive layer may be further disposed between the lower metal layer BML and the data conductive layer.

When the illustrated gate conductive layer is referred to as a first gate conductive layer, for example, a second gate conductive layer used as the other electrode of a capacitor may be further disposed between the first gate conductive layer and the data conductive layer. In addition, when the display panel PNL includes heterogeneous transistors such as a polysilicon transistor and an oxide semiconductor transistor, a third gate conductive layer may be further disposed on an upper or lower side of the first gate conductive layer, in addition to the first gate conductive layer used as a gate electrode GE of the polysilicon transistor. Here, the second gate conductive layer and/or the third gate conductive layer may have the same stacked structure as that of the first gate conductive layer. A larger number of other gate conductive layers may be interposed.

In addition, when the illustrated data conductive layer is referred to as a first data conductive layer, another conductive layer for serving as a line or an electrode that the data conductive layer serves herein may be disposed between the first data conductive layer and the gate conductive layer. For example, when a second data conductive layer and/or a third data conductive layer are disposed between the first data conductive layer and the gate conductive layer, the data line, the source electrode SE, the drain electrode DE, the first driving voltage line, the second driving voltage line, and the third driving voltage line may be formed by selecting any one of the first data conductive layer, the second data conductive layer, and the third data conductive layer. A large number of other data conductive layers may be disposed.

A via insulating layer VIA (or an organic insulating film) is disposed on the data conductive layer. The via insulating layer VIA may have a flat top surface. The via insulating layer VIA is disposed to cover an entire surface of the interlayer insulating layer ILD on which the data conductive layer is disposed.

The via insulating layer VIA may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB).

A pixel electrode layer PXEL including pixel electrodes is disposed on the via insulating layer VIA. The pixel electrodes disposed one by one for each pixel may be spaced apart from each other. For example, the pixel electrode layer PXEL may include a first pixel electrode PXE1 of the first pixel PX1, a second pixel electrode PXE2 of the second pixel PX2, and a third pixel electrode PXE3 of the third pixel PX3.

Each of the pixel electrodes PXE1, PXE2, and PXE3 may be electrically connected to the drain electrode DE of the thin film transistor through a contact hole (or via hole) penetrating through the via insulating layer VIA. Each of the pixel electrodes PXE1, PXE2, and PXE3 may serve as an anode electrode of a light emitting element.

In some embodiments, the pixel electrode layer PXEL may have a stacked film structure in which a material layer having a high work function, such as indium tin oxide (ITO), indium zinc oxide (IZO), zinc oxide (ZnO), or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof are stacked. In this case, the layer having the high work function may be disposed above the reflective material layer and disposed close to an intermediate layer ML to be described later.

In some embodiments, the pixel electrode layer PXEL may have a multilayer structure of ITO/Mg, ITO/MgF, ITO/Ag, and ITO/Ag/ITO.

A pixel defining layer PDL is disposed on the pixel electrode layer PXEL. The pixel defining layer PDL serves to define a light emitting area. For example, the pixel defining layer PDL may define a first light emitting area EA1 as an opening that at least partially exposes and extends to the first pixel electrode PXE1, a second light emitting area EA2 as an opening that at least partially exposes and extends to the second pixel electrode PXE2, and a third light emitting area EA3 as an opening that at least partially exposes and extends to the third pixel electrode PXE3.

Meanwhile, the first light emitting area EA1, the second light emitting area EA2, and the third light emitting area EA3 may be referred to as a first opening, a second opening, and a third opening, respectively.

The pixel defining layer PDL may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). The pixel defining layer PDL may also include an inorganic material. In addition, the pixel defining layer PDL may also include a stacked film of an inorganic layer and an organic layer.

Auxiliary electrodes UDE1 and UDE2 having an undercut shape may be disposed on a portion of each of the pixel electrodes PXE1, PXE2, and PXE3 of each of the pixels PX1, PX2, PX3 exposed by the light emitting areas EA1, EA2, and EA3 defined by the pixel defining layer PDL, i.e., to which the light emitting areas EA1, EA2, and EA3 extend.

In some embodiments, structures of the auxiliary electrodes UDE1 and UDE2 disposed on each of the pixel electrodes PXE1, PXE2, and PXE3 of each of the pixels PX1, PX2, and PX3 may be the same. However, in an embodiment, the structures of the auxiliary electrodes UDE1 and UDE2 disposed on each of the pixel electrodes PXE1, PXE2, and PXE3 of each of the pixels PX1, PX2, and PX3 may be different for each of the pixels PX1, PX2, and PX3. Herein it will be mainly described that the structures of the auxiliary electrodes UDE1 and UDE2 disposed on each of the pixel electrodes PXE1, PXE2, and PXE3 of each of the pixels PX1, PX2, and PX3 are the same.

The first auxiliary electrode UDE1 and the second auxiliary electrode UDE2 disposed thereon may be disposed on each of the pixel electrodes PXE1, PXE2, and PXE3 of each of the pixels PX1, PX2, and PX3. A side surface of the first auxiliary electrode UDE1 may be positioned inner than a side surface of the second auxiliary electrode UDE2 to form an undercut shape. Stated another way, the side surface of the first auxiliary electrode UDE1 may be positioned inward of the side surface of the second auxiliary electrode UDE2 within the light emitting areas EA1, EA2, EA3, i.e., within the first, second, and third openings, of the pixel defining layer PDL to form an undercut shape. Accordingly, a hole injection layer HIL of an intermediate layer ML, which will be described later, may be disconnected and disposed for each of the pixels PX1, PX2, and PX3. An undercut shape formed by the first auxiliary electrode UDE1 and the second auxiliary electrode UDE2 will be described later in detail.

The intermediate layer ML may be disposed on the pixel defining layer PDL and the second auxiliary electrode UDE2 disposed on each of the pixels PX1, PX2, and PX3. The intermediate layer ML may include the hole injection layer HIL, a hole transport layer HTL, a light-emitting layer EML, an electron transport layer ETL, and an electron injection layer EIL that are sequentially stacked.

In this case, holes move from the pixel electrodes PXE1, PXE2, and PXE3, which are positive electrodes, to the light-emitting layer EML through the hole injection layer HIL and the hole transport layer HTL, and electrons move from the common electrode CE, which is a negative electrode, to the light-emitting layer EML through the electron injection layer EIL and the electron transport layer ETL. In addition, the holes and the electrons moved to the light-emitting layer EML combine to form excitons, and are excited in an unstable energy state, then return to a stable state and emit light.

Some of the element layers constituting the intermediate layer ML of the display device 1 according to an embodiment may substantially integrally extend to cover each opening of the pixel defining layer PDL. For example, the hole transport layer HTL, the electron injection layer EIL, and the electron transport layer ETL of the intermediate layer ML may integrally extend to cover not only a top surface of the pixel defining layer PDL, but also a side surface of the pixel defining layer PDL forming the first light emitting area EA1, the second light emitting area EA2, and the third light emitting area EA3 defined by the pixel defining layer PDL.

In the case of the light-emitting layer EML, a wavelength of emitted light varies according to a type of organic material included therein. Accordingly, in some embodiments, in order for the pixels PX1, PX2, and PX3 to emit light of different wavelengths, the light-emitting layer EML may be disconnected and disposed for each of the pixels PX1, PX2, and PX3. For example, the light-emitting layer EML may include a first light-emitting layer EML1 disposed in the first pixel PX1, a second light-emitting layer EML2 disposed in the second pixel PX2, and a third light-emitting layer EML3 disposed in the third pixel PX3.

The hole injection layer HIL is entirely formed on each of the pixels PX1, PX2, and PX3, but may be disconnected on the second auxiliary electrode UDE2 of each of the pixels PX1, PX2, and PX3 by the undercut shape formed by the first auxiliary electrode UDE1 and the second auxiliary electrode UDE2 disposed in each for the pixels PX1, PX2, and PX3.

The reason for this is as follows. In order for each of the pixels PX1, PX2, and PX3 to be independently driven in the light emitting method as described above, the driving voltage needs to be independently applied to each of the pixels PX1, PX2, and PX3. However, in the case in which the hole injection layer HIL having relatively high conductivity among the various element layers constituting the intermediate layer ML integrally extends as in the case of the hole transport layer HTL, the electron injection layer EIL, and the electron transport layer ETL and covers each opening of the pixel defining layer PDL, when the driving current is applied to any one of the pixels PX1, PX2, and PX3, the driving current is applied to another pixel along the hole injection layer HIL and acts as a leakage current affecting driving. Accordingly, the hole injection layer HIL having the relatively high conductivity needs to be disconnected and disposed for each of the pixels PX1, PX2, and PX3.

In some embodiments, the hole injection layer HIL may include a material having high conductivity, such as NDP-9(2-(7-Dicyanomethylene-1,3,4,5,6,8,9,10-octafluoro-7H-pyren-2-ylidene)-malononitrile).

A structure in which the hole injection layer HIL is disconnected by the undercut shape formed by the first auxiliary electrode UDE1 and the second auxiliary electrode UDE2 will be described later in detail.

The common electrode CE is disposed on the intermediate layer ML. The common electrode CE may integrally extend to cover each opening of the pixel defining layer PDL. In other words, the common electrode CE generally covers the intermediate layer ML. For example, the common electrode CE may be disposed to cover an entirety of the display area DA of the display panel PNL in plan view.

In some embodiments, the common electrode CE may include a material layer having a small work function, such as Li, Ca, LiF/Ca, LiF/Al, Al, Mg, Ag, Pt, Pd, Ni, Au, Nd, Jr, Cr, BaF, Ba, or a compound or mixture thereof, e.g., a mixture of Ag and Mg, etc. The common electrode CE may further include a transparent metal oxide layer disposed on the material layer having the small work function.

Hereinafter, the undercut shape formed by the first auxiliary electrode UDE1 and the second auxiliary electrode UDE2 and the shape of the hole injection layer HIL disconnected by the undercut shape will be described in more detail.

Figure 6:
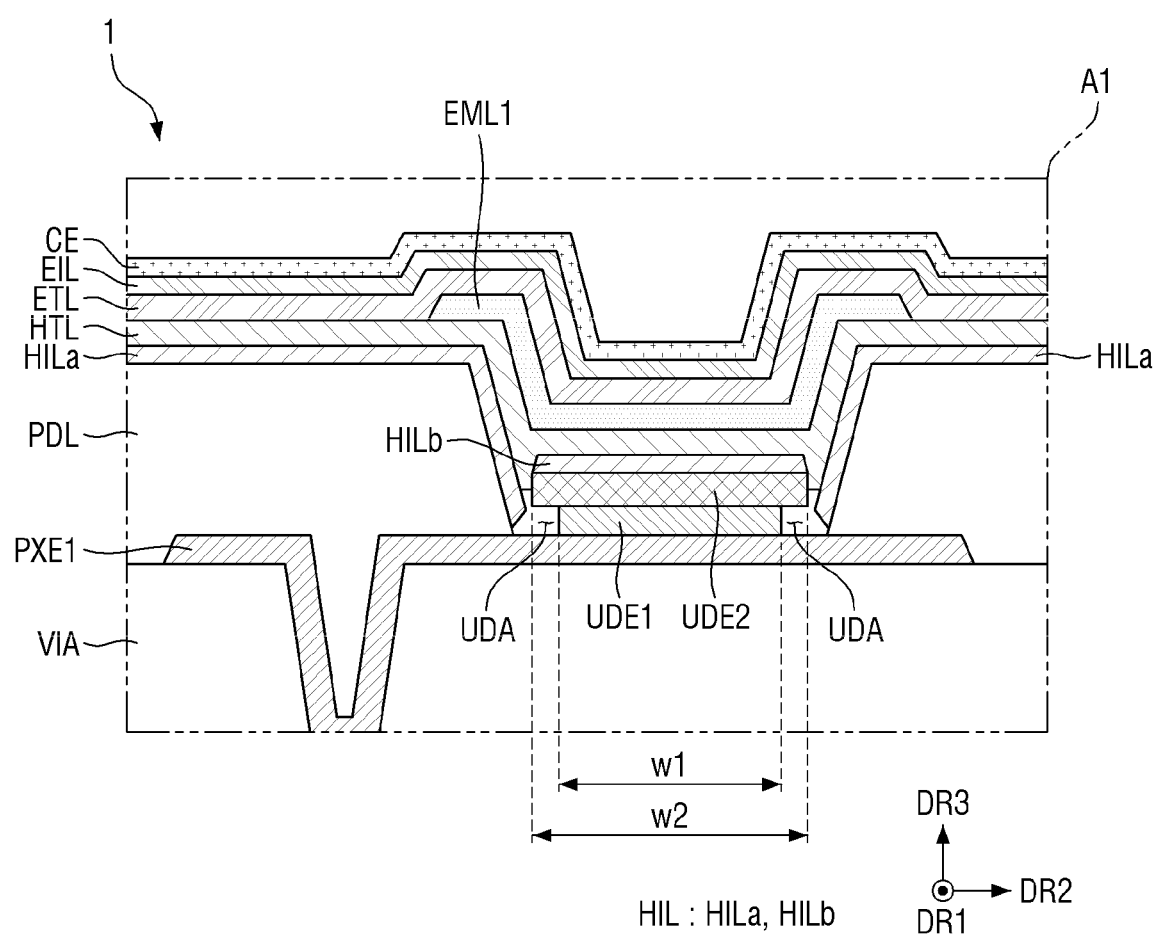
FIG. 6 is an enlarged view of area A1 of FIG. 5.

FIG. 6 is an enlarged view of area A1 of FIG. 5.

FIG. 6 illustrates structures of the first auxiliary electrode UDE1, the second auxiliary electrode UDE2, the intermediate layer ML (see FIG. 5), and the common electrode CE disposed on the first pixel electrode PXE1 of the first pixel PX1.

As described above, the auxiliary electrodes UDE1 and UDE2 disposed on each of the pixel electrodes PXE1, PXE2, and PXE3 of the display device 1 according to the embodiment have the same structure. Therefore, hereinafter, for convenience of explanation, the structure of the auxiliary electrodes UDE1 and UDE2 disposed on the first pixel electrode PXE1 of the first pixel PX1 will be mainly described, and a description of the structures of the auxiliary electrodes UDE1 and UDE2 disposed on the second pixel electrode PXE2 and the third pixel electrode PXE3 will be omitted.

Referring to FIG. 6 together with FIG. 5, the first auxiliary electrode UDE1 having a first width w1 in the second direction DR2 may be disposed on a portion of the first pixel electrode PXE1 exposed by the pixel defining layer PDL, i.e., to which the first light emitting area EA1 extends.

In some embodiments, the first width w1 of the first auxiliary electrode UDE1 may be smaller than a width of a portion of the first pixel electrode PXE1 exposed by the pixel defining layer PDL in the second direction DR2. It is illustrated in FIG. 6 that the first width w1 of the first auxiliary electrode UDE1 is smaller than the width of a portion of the first pixel electrode PXE1 exposed by the pixel defining layer PDL in the second direction DR2.

The second auxiliary electrode UDE2 having a second width w2 in the second direction DR2 may be disposed on the first auxiliary electrode UDE1. The second width w2 may be greater than the first width w1. The second auxiliary electrode UDE2 may protrude from the first auxiliary electrode UDE1 to both sides in the second direction DR2 in a cross-sectional view. Accordingly, an undercut shape in which a side surface of the first auxiliary electrode UDE1 is positioned more inward than a side surface of the second auxiliary electrode UDE2 may be formed.

Specifically, an undercut area UDA defined by the undercut shape formed by the first auxiliary electrode UDE1 and the second auxiliary electrode UDE2 may be defined as a space formed by a bottom surface of a portion of the second auxiliary electrode UDE2 protruding from the first auxiliary electrode UDE1 and the side surface of the first auxiliary electrode UDE1. The undercut area UDA may be disposed on a portion of the first pixel electrode PXE1 exposed by the pixel defining layer PDL where the first auxiliary electrode UDE1 is not disposed.

The hole injection layer HIL may include a first portion HILa disposed on the pixel defining layer PDL and a second portion HILb disposed on the second auxiliary electrode UDE2. In other words, the hole injection layer HIL may be disposed to be separated into the first portion HILa and the second portion HILb by the undercut shape formed by the first auxiliary electrode UDE1 and the second auxiliary electrode UDE2. In other words, the hole injection layer HIL may be deposited with poor step coverage due to the undercut shape formed by the first auxiliary electrode UDE1 and the second auxiliary electrode UDE2.

The first portion HILa of the hole injection layer HIL may be disposed along a profile of the pixel defining layer PDL. For example, the first portion HILa may extend in a flat profile along the pixel defining layer PDL, and then be bent at least once and extended along the side surface of the pixel defining layer PDL forming the opening of the pixel defining layer PDL. The first portion HILa may not be in contact with a portion of the first pixel electrode PXE1 exposed by the opening of the pixel defining layer PDL.

The second portion HILb of the hole injection layer HIL may be disconnected from the first portion HILa and disposed on the second auxiliary electrode UDE2. In other words, the first portion HILa and the second portion HILb may be physically separated.

With the configuration as described above, since the hole injection layer HIL is disconnected for each of the pixels PX1, PX2, and PX3 even if a driving current is applied to adjacent pixels, independent driving of each of the pixels PX1, PX2, PX3 may be facilitated by preventing or at least reducing an occurrence of leakage current affecting driving of the adjacent pixels.

Hereinafter, a manufacturing method of manufacturing the display device 1 according to an embodiment will be described.

FIGS. 7 to 11 are views for describing a process of manufacturing a display device according to an embodiment. FIGS. 7 to 11 illustrate cross-sectional views of each process of forming the first auxiliary electrode UDE1, the second auxiliary electrode UDE2, and the hole injection layer HIL of the display device 1 according to an embodiment.

Figure 7:
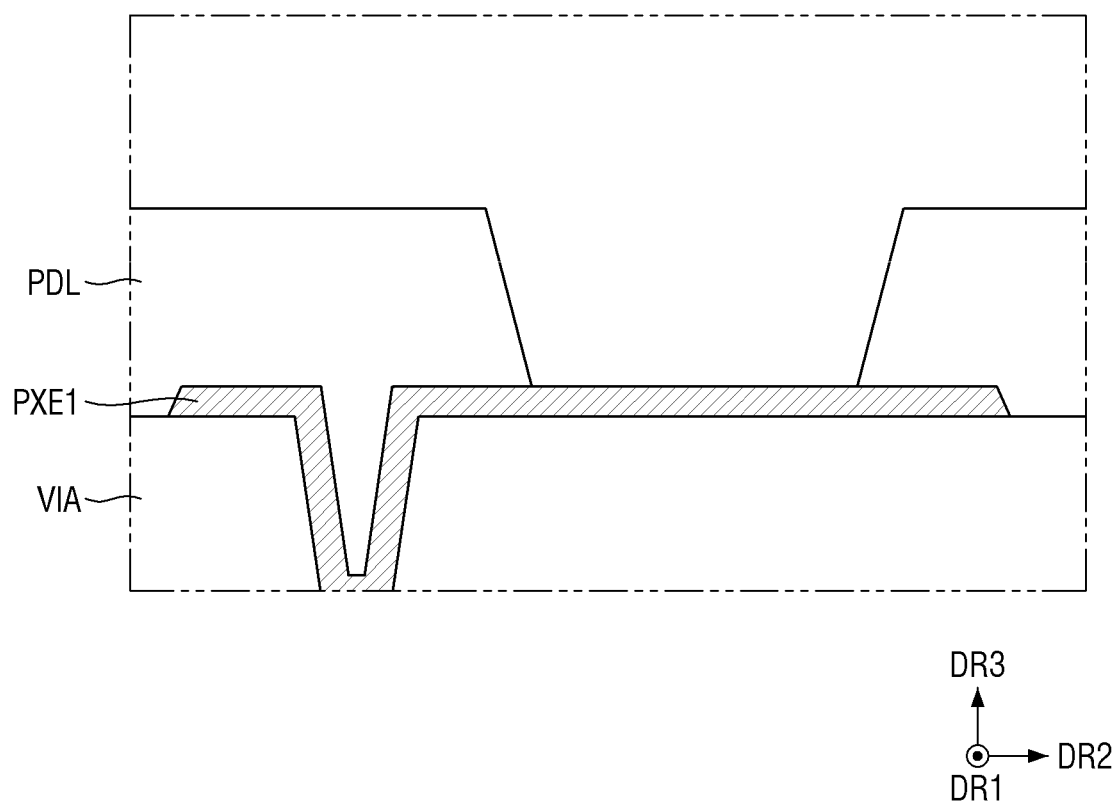
FIGS. 7, 8, 9, 10, and 11 are views for describing a process of manufacturing a display device according to an embodiment.

First, referring to FIG. 7, a pixel defining layer PDL having an opening formed therein is formed on the first pixel electrode PXE1 on the via insulating layer VIA. An method of forming the pixel defining layer PDL is as follows.

First, an organic material layer for forming the pixel defining layer PDL may be coated, dried, and baked, and then exposed using a photomask including a light transmitting area and a light blocking area, and exposed portions of the provided organic material layer may be selectively removed by using a developer.

Figure 8:
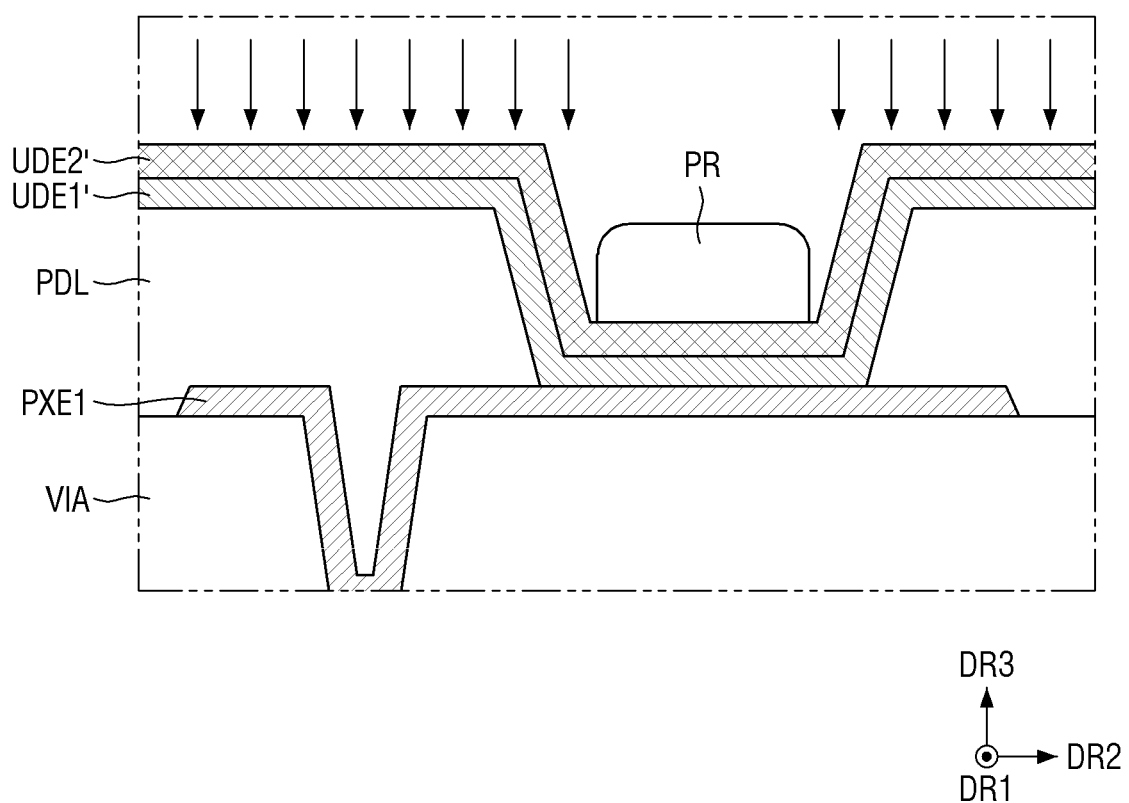

Next, referring to FIG. 8, a first auxiliary electrode UDE1 and a second auxiliary electrode UDE2 are formed by forming a first auxiliary electrode material layer UDE1' and a second auxiliary electrode material layer UDE2' covering the pixel defining layer PDL and the opening formed therein on the pixel defining layer PDL in which the opening is formed. A photoresist pattern PR is formed on a portion of the first auxiliary electrode material layer UDE1' and the second auxiliary electrode material layer UDE2' corresponding to the opening formed in the pixel defining layer PDL. The first auxiliary electrode material layer UDE1' and the second auxiliary electrode material layer UDE2' are etched using the photoresist pattern PR as an etch stop layer.

The process of etching the first auxiliary electrode material layer UDE1' and the second auxiliary electrode material layer UDE2' may be performed by, for example, dry etching. In this case, portions of the first auxiliary electrode material layer UDE1' and the second auxiliary electrode material layer UDE2' that are not covered by the photoresist pattern PR may be etched, and portions thereof covered by the photoresist pattern PR may remain.

The portions of the first auxiliary electrode material layer UDE1' and the second auxiliary electrode material layer UDE2' that are not etched and remain may become a first auxiliary electrode UDE1 and a second auxiliary electrode UDE2, respectively. In this case, side surfaces of the first auxiliary electrode UDE1 and the second auxiliary electrode UDE2 are substantially aligned with each other.

The first auxiliary electrode material layer UDE1' and the second auxiliary electrode material layer UDE2' may include materials having different selectivities for any one etchant as different materials. For example, the second auxiliary electrode material layer UDE2' may include titanium (Ti) or molybdenum (Mo), and the first auxiliary electrode material layer UDE1' may include aluminum (AL).

The first auxiliary electrode material layer UDE1' and the first auxiliary electrode UDE1 may include the same material, and the second auxiliary electrode material layer UDE2' and the second auxiliary electrode UDE2 may include the same material.

Figure 9:
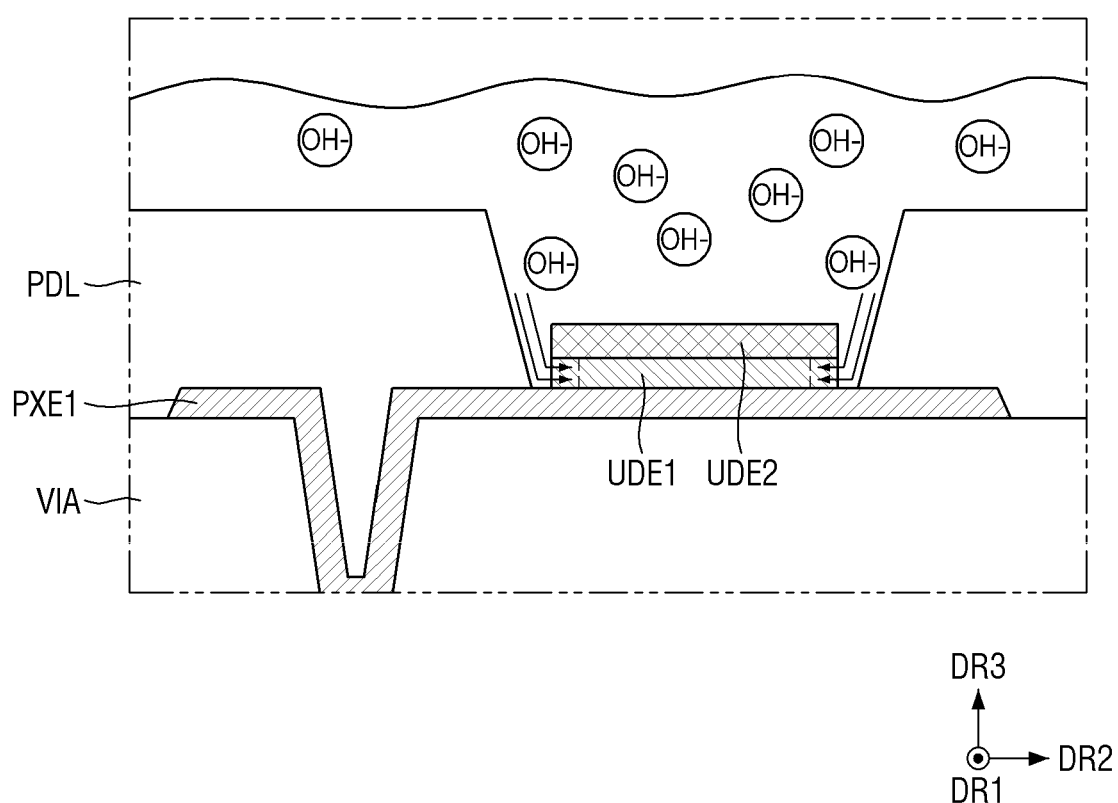
Figure 10:
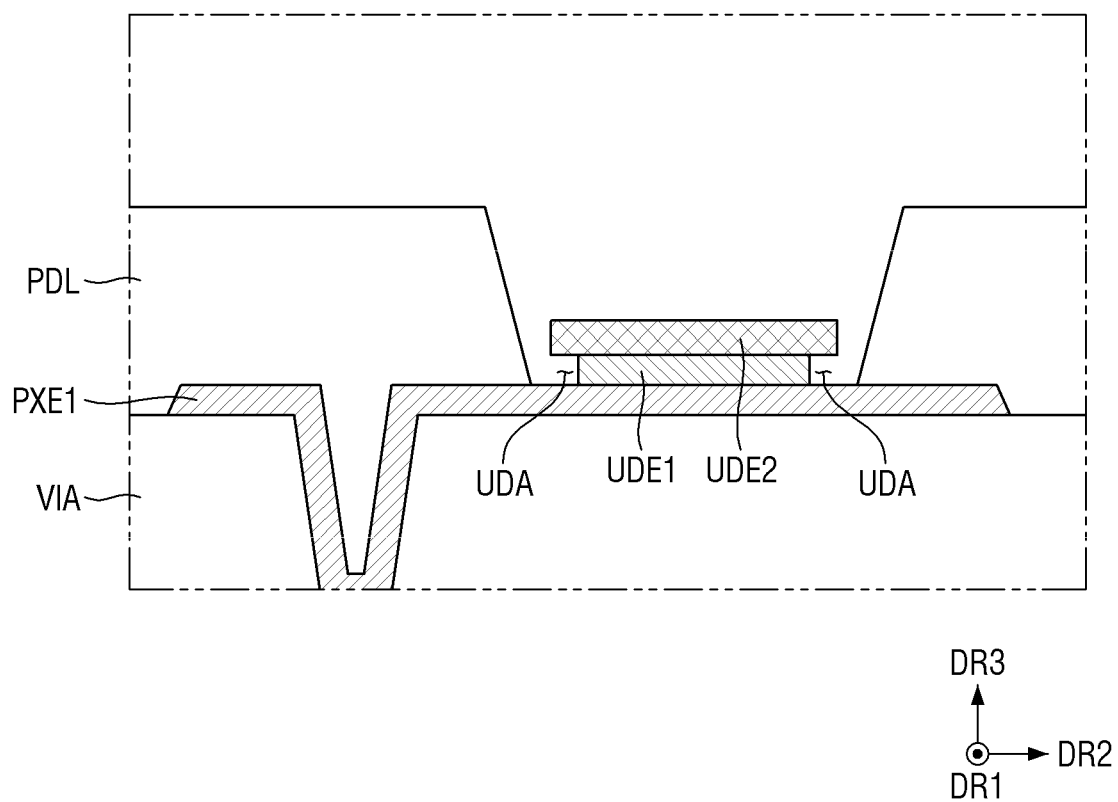

Next, referring to FIGS. 9 and 10, a side surface of the first auxiliary electrode UDE1 is etched to form an undercut shape. The process of etching the side surface of the first auxiliary electrode UDE1 may be performed by, for example, wet etching.

Since the first auxiliary electrode UDE1 and the second auxiliary electrode UDE2 include the materials having different selectivities for any one etchant as described above, only the side surface of the first auxiliary electrode UDE1 may be etched using such a feature.

Accordingly, an undercut shape in which the side surface of the first auxiliary electrode UDE1 is positioned inner than the side surface of the second auxiliary electrode UDE2 may be formed. In other words, an undercut area UDA defined by the undercut shape formed by the first auxiliary electrode UDE1 and the second auxiliary electrode UDE2 may be defined as a space formed by a bottom surface of a portion of the second auxiliary electrode UDE2 protruding from the first auxiliary electrode UDE1 and the side surface of the first auxiliary electrode UDE1. The undercut area UDA may be disposed on a portion of the first pixel electrode PXE1 exposed by the pixel defining layer PDL where the first auxiliary electrode UDE1 is not disposed.

Figure 11:
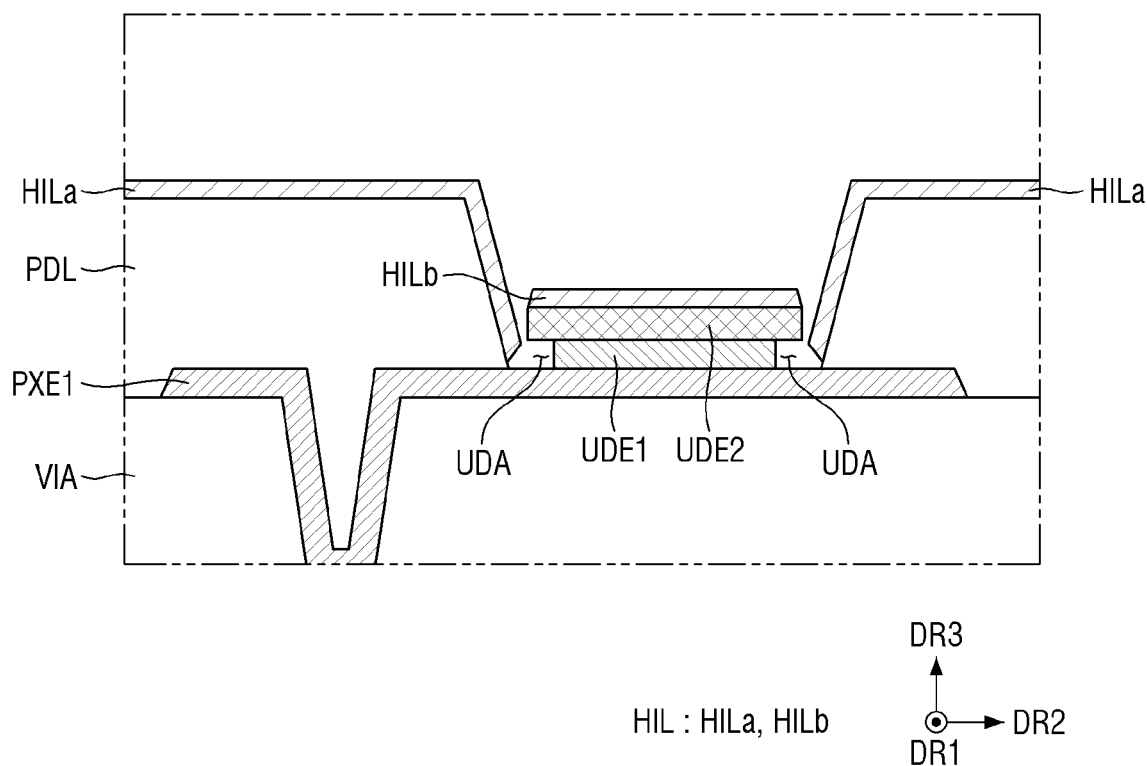

Next, referring to FIG. 11, a hole injection layer HIL is deposited. The hole injection layer HIL may be deposited with poor step coverage due to the undercut shape formed by the first auxiliary electrode UDE1 and the second auxiliary electrode UDE2.

Accordingly, the hole injection layer HIL may include a first portion HILa disposed on the pixel defining layer PDL and a second portion HILb disposed on the second auxiliary electrode UDE2. In other words, the hole injection layer HIL may be disposed to be separated into the first portion HILa and the second portion HILb by the undercut shape formed by the first auxiliary electrode UDE1 and the second auxiliary electrode UDE2.

Hereinafter, other embodiments of the display device 1 will be described. In the following embodiments, the same components as those of the above-described embodiment will be denoted by the same reference numerals, and an overlapping description thereof will be omitted or simplified and differences will be mainly described.

Figure 12:
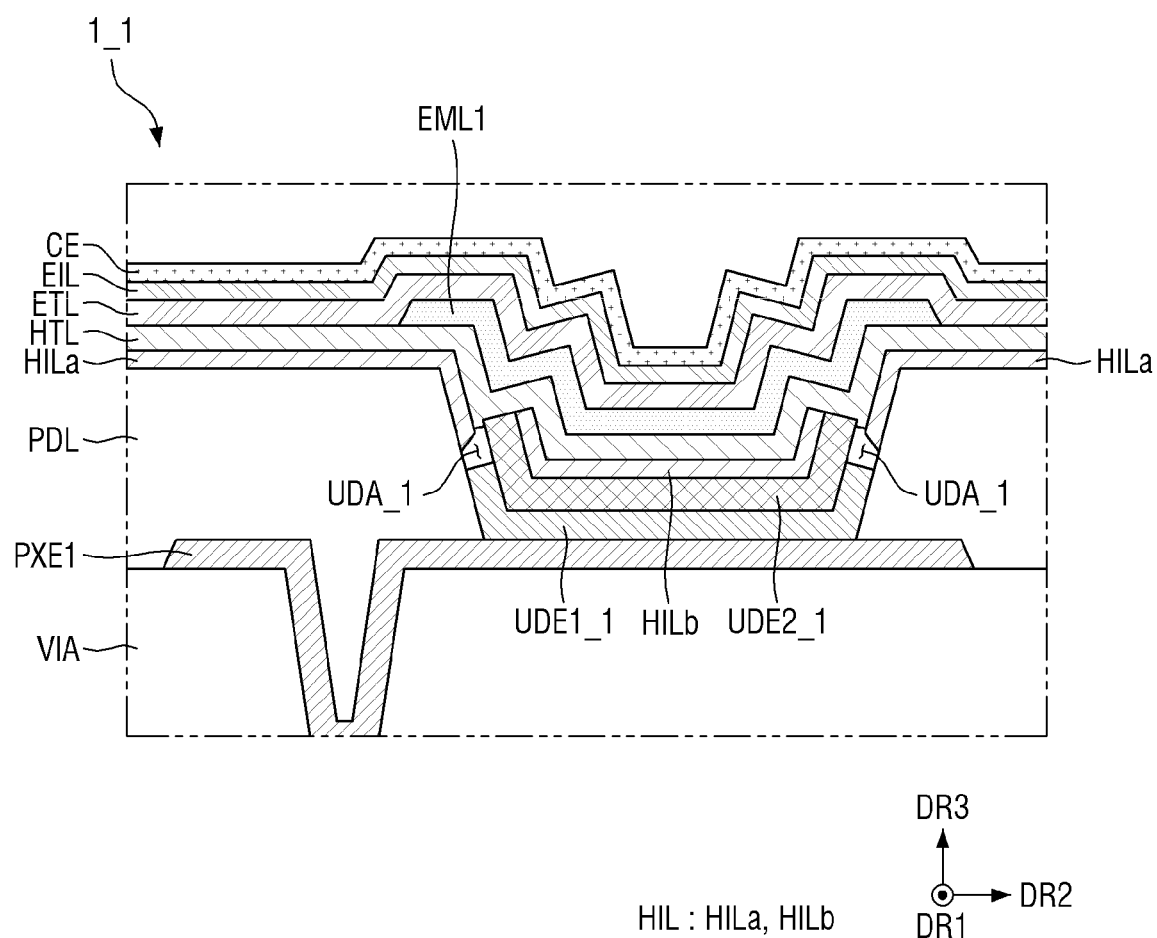
FIG. 12 is a cross-sectional view of a pixel structure of a display device according to an embodiment.

FIG. 12 is a cross-sectional view of a pixel structure of a display device according to an embodiment.

Referring to FIG. 12, it is illustrated that a display device 1_1 according to the present embodiment includes an undercut area UDA_1 disposed on the side surface of the pixel defining layer PDL defining the opening of the pixel defining layer PDL.

A first auxiliary electrode UDE1_1 and a second auxiliary electrode UDE2_1 of the display device 1_1 according to the present embodiment may each integrally extend to cover an entirety of a portion of the first pixel electrode PXE1 exposed by the opening of the pixel defining layer PDL and a portion of the side surface of the pixel defining layer PDL defining the opening of the pixel defining layer PDL. Accordingly, the first auxiliary electrode UDE1_1 and the second auxiliary electrode UDE2_1 may have a shape similar to a 'U' in cross-sectional view. In this case, a profile of the element layer constituting the intermediate layer ML (see FIG. 5) and a profile of the common electrode CE may be deposited to correspond to profiles of the first auxiliary electrode UDE1_1 and the second auxiliary electrode UDE2_1.

Meanwhile, the first portion HILa of the hole injection layer HIL may not be in contact with a side surface of the first auxiliary electrode UDE1_1.

With the configuration as described above, the undercut shape of the first auxiliary electrode UDE1_1 and the second auxiliary electrode UDE2_1 may be more easily formed.

Figure 13:
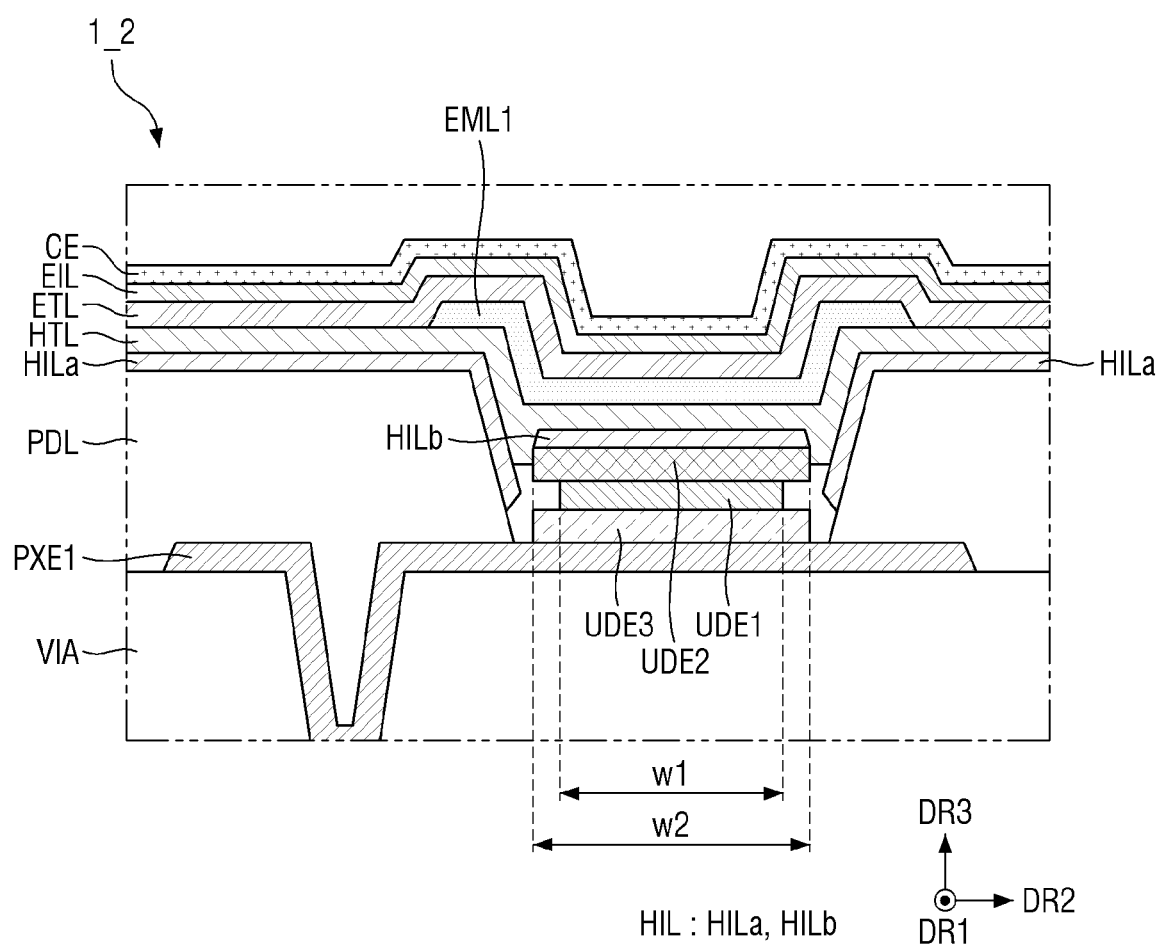
FIG. 13 is a cross-sectional view of a pixel structure of a display device according to an embodiment.

FIG. 13 is a cross-sectional view of a pixel structure of a display device according to an embodiment.

Referring to FIG. 13, it is illustrated that a display device 1_2 according to the present embodiment may include a third auxiliary electrode UDE3 added between the first pixel electrode PXE1 and the first auxiliary electrode UDE1.

In some embodiments, the third auxiliary electrode UDE3 may have the same second width w2 in the second direction DR2 as the second auxiliary electrode UDE2. However, in an embodiment, the third auxiliary electrode UDE3 may also have the same first width w1 in the second direction DR2 as the first auxiliary electrode UDE1. FIG. 13 illustrates that the third auxiliary electrode UDE3 has the same second width w2 in the second direction DR2 as the second auxiliary electrode UDE2.

In this case, the undercut area defined by the undercut shape formed by the first auxiliary electrode UDE1 and the second auxiliary electrode UDE2 may be disposed on a portion of the third auxiliary electrode UDE3 where the first auxiliary electrode UDE1 is not disposed.

With the configuration as described above, a structure in which the first portion HILa of the hole injection layer HIL is not in contact with the first pixel electrode PXE1 may be more easily formed.

Figure 14:
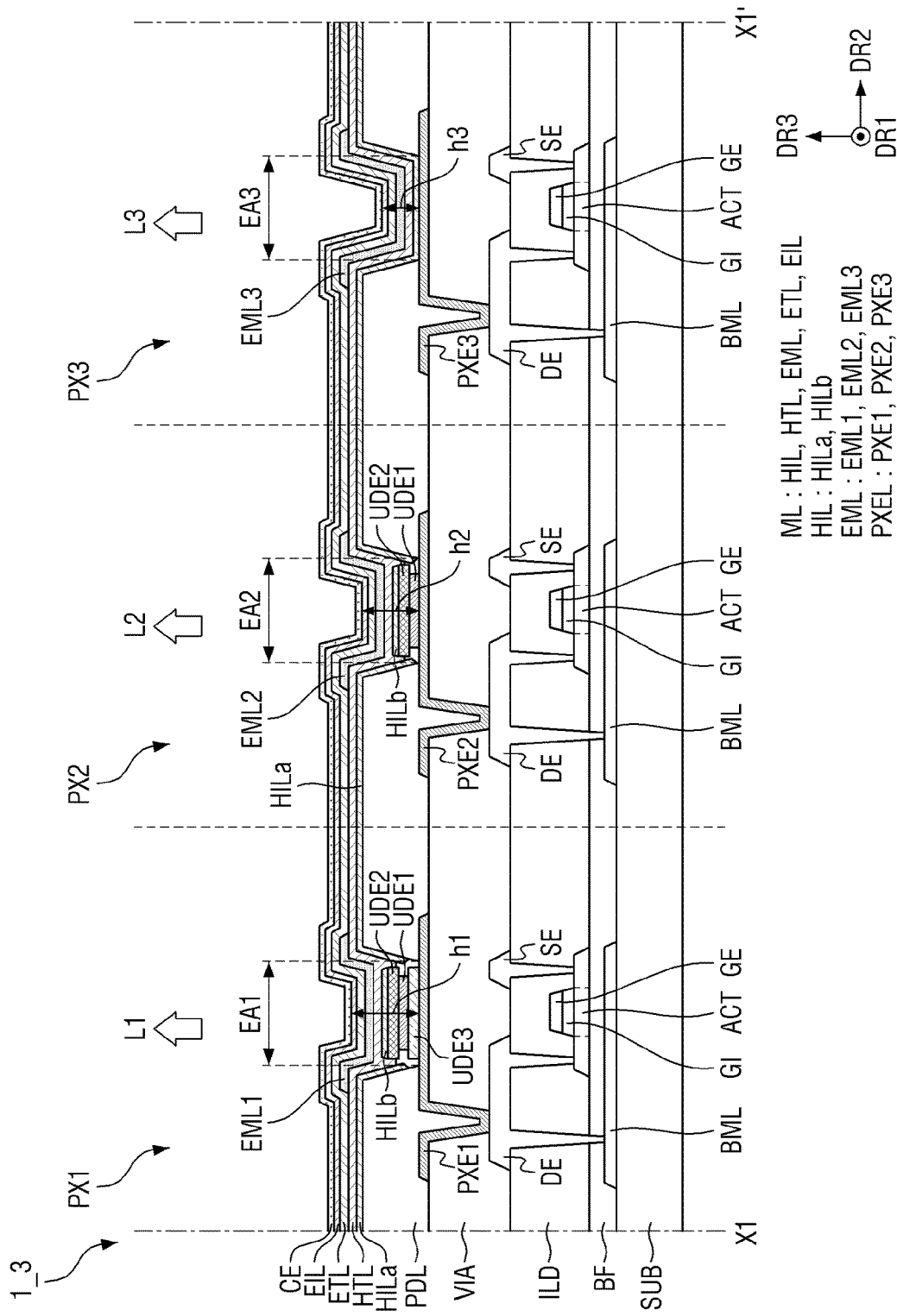
FIG. 14 is a cross-sectional view of a pixel structure of a display device according to an embodiment.

FIG. 14 is a cross-sectional view of a pixel structure of a display device according to an embodiment.

Referring to FIG. 14, it is illustrated that a display device 1_3 according to the present embodiment has structures of the pixels PX1, PX2, and PX3 different from each other. For example, the first pixel PX1 may have the same structure as the pixel structure of the display device 1_2 according to the embodiment of FIG. 13, the second pixel PX2 may have the same structure as the pixel structure of the display device 1 according to the embodiment of FIG. 6, and the auxiliary electrode may not be disposed in the third pixel PX3.

Since a structure of the first pixel PX1 of the display device 1_3 according to the present embodiment is the same as that described with reference to FIG. 13 and a structure of the second pixel PX2 is the same as that described in FIG. 6, a detailed description thereof will be omitted.

In the case of the third pixel PX3 of the display device 1_3 according to the present embodiment, the hole injection layer HIL may not be separated and integrally formed to cover a portion of the third pixel electrode PXE3 exposed by the pixel defining layer PDL.

With the structure as described above, in the display device 1_3 according to the present embodiment, a linear distance h1 from the first pixel electrode PXE1 to the common electrode CE in the first pixel PX1 may be greater than a linear distance h2 from the second pixel electrode PXE2 to the common electrode CE in the second pixel PX2, and the linear distance h2 from the second pixel electrode PXE2 to the common electrode CE in the second pixel PX2 may be greater than a linear distance h3 from the third pixel electrode PXE3 to the common electrode CE in the third pixel PX3.

For example, since the first pixel PX1 further includes the third auxiliary electrode UDE3 compared to the second pixel PX2, the linear distance h1 from the first pixel electrode PXE1 to the common electrode CE may be greater than the linear distance h2 from the second pixel electrode PXE2 to the common electrode CE. In addition, since the first auxiliary electrode UDE1 and the second auxiliary electrode UDE2 are omitted in the third pixel PX3 compared to the second pixel PX2, the linear distance h3 from the third pixel electrode PXE3 to the common electrode CE may be smaller than the linear distance h2 from the second pixel electrode PXE2 to the common electrode CE.

Accordingly, in the display device 1_3 according to the present embodiment, the structure of each of the pixels PX1, PX2, and PX3 may be differentiated by considering a thickness of the intermediate layer required for a resonance phenomenon of each light emitted by each of the pixels PX1, PX2, and PX3 and at the same time considering an influence of leakage current that may occur by adjacent pixels.

Specifically, the thickness of the intermediate layer required for the resonance phenomenon may vary according to a wavelength of light emitted by each of the pixels PX1, PX2, and PX3. In general, the thickness of the intermediate layer required for the resonance phenomenon may have a proportional correlation with the wavelength of emitted light. In addition, when each of the pixels PX1, PX2, and PX3 is driven in a low grayscale, a pixel emitting light in a blue wavelength band may be hardly affected by the leakage current.

Therefore, when the first pixel PX1 emits first light L1 in a red wavelength band, the second pixel PX2 emits second light L2 in a green wavelength band, and the third pixel PX3 emits third light L3 in a blue wavelength band, the linear distance h1 from the first pixel electrode PXE1 to the common electrode CE may be adjusted to about 3000 Å and the occurrence of the leakage current may be prevented or at least reduced by forming the structure of the first pixel PX1 to be identical to that of the display device 1_2 according to the embodiment of FIG. 13. The linear distance h2 from the second pixel electrode PXE2 to the common electrode CE may be adjusted to about 2500 Å and the occurrence of the leakage current may be prevented or at least reduced by forming the structure of the second pixel PX2 to be identical to that of the display device 1 according to the embodiment of FIG. 6. The linear line distance h3 from the third pixel electrode PXE3 to the common electrode CE may be adjusted to about 2000 Å by forming the structure of the third pixel PX3 such that the first auxiliary electrode UDE1 and the second auxiliary electrode UDE2 are omitted as described above.

In this case, since the third light L3 emitted from the third pixel PX3 is light in the blue wavelength band that is hardly affected by the leakage current at low grayscale, the hole injection layer HIL disposed in the third pixel PX3 is not necessarily disconnected.

In concluding the detailed description, those skilled in the art will appreciate that many variations and modifications can be made to the embodiments without substantially departing from the principles of the inventive concept. Therefore, the disclosed embodiments are used in a generic and descriptive sense only and not for purposes of limitation.

What is claimed is:

1. A display device comprising:
a pixel electrode disposed on a substrate;
a pixel defining layer disposed on the pixel electrode and comprising an opening extending to a portion of the pixel electrode;
a first auxiliary electrode disposed on the portion of the pixel electrode to which the opening of the pixel defining layer extends;
a second auxiliary electrode disposed on the first auxiliary electrode;
an intermediate layer disposed on the pixel defining layer and the second auxiliary electrode; and
a common electrode disposed on the intermediate layer,
wherein the intermediate layer includes a hole injection layer, a light-emitting layer, and an electron injection layer that are sequentially stacked,
a side surface of the first auxiliary electrode is positioned inward of a side surface of the second auxiliary electrode within the opening of the pixel defining layer to form an undercut shape, and
the hole injection layer of the intermediate layer includes:
a first portion disposed on a side surface of the pixel defining layer defining the opening of the pixel defining layer, and
a second portion disconnected from the first portion and disposed on the second auxiliary electrode.

2. The display device of claim 1, wherein the intermediate layer further includes a hole transport layer disposed between the light-emitting layer and the hole injection layer, and
the hole transport layer integrally extends to cover the side surface of the pixel defining layer defining the opening of the pixel defining layer and the second auxiliary electrode.

3. The display device of claim 2, wherein the intermediate layer further includes an electron transport layer disposed between the light-emitting layer and the electron injection layer, and
the electron transport layer and the electron injection layer integrally extend to cover the side surface of the pixel defining layer defining the opening of the pixel defining layer and the second auxiliary electrode.

4. The display device of claim 3, wherein the hole injection layer includes NDP-9.

5. The display device of claim 1, wherein the first auxiliary electrode covers a portion of the portion of the pixel electrode to which the opening of the pixel defining layer extends, and
the second auxiliary electrode is spaced apart from the pixel electrode with the first auxiliary electrode interposed between the second auxiliary electrode and the pixel electrode.

6. The display device of claim 5, wherein an undercut space defined by a bottom surface of the second auxiliary electrode and the side surface of the first auxiliary electrode is disposed on a top surface of the pixel electrode.

7. The display device of claim 6, wherein the first portion of the hole injection layer is not in contact with the pixel electrode.

8. The display device of claim 1, wherein the first auxiliary electrode and the second auxiliary electrode integrally extend to cover an entirety of the portion of the pixel electrode to which the opening of the pixel defining layer extends and a portion of the side surface of the pixel defining layer defining the opening of the pixel defining layer.

9. The display device of claim 8, wherein an undercut space defined by a bottom surface of the second auxiliary electrode and the side surface of the first auxiliary electrode is disposed on the side surface of the pixel defining layer defining the opening of the pixel defining layer.

10. The display device of claim 9, wherein the first portion of the hole injection layer is not in contact with the side surface of the first auxiliary electrode.

11. The display device of claim 1, further comprising a third auxiliary electrode disposed between the first auxiliary electrode and the pixel electrode,
wherein a side surface of the third auxiliary electrode is positioned outward of the side surface of the first auxiliary electrode within the opening of the pixel defining layer.

12. The display device of claim 11, wherein an undercut space defined by a bottom surface of the second auxiliary electrode and the side surface of the first auxiliary electrode is disposed on a top surface of the third auxiliary electrode.

13. A display device comprising:
a pixel electrode layer including a first pixel electrode, a second pixel electrode, and a third pixel electrode disposed to be spaced apart from each other on a substrate;
a pixel defining layer disposed on the pixel electrode layer and comprises a first opening extending to a portion of the first pixel electrode, a second opening extending to a portion of the second pixel electrode, and a third opening extending to a portion of the third pixel electrode;
an intermediate layer disposed on the pixel defining layer and extending to cover the first opening, the second opening, and the third opening of the pixel defining layer;
a first auxiliary electrode and a second auxiliary electrode disposed between the intermediate layer and at least one of the first pixel electrode, the second pixel electrode, and the third pixel electrode and sequentially stacked; and
a common electrode disposed on the intermediate layer and extending to cover the first opening, the second opening, and the third opening of the pixel defining layer,
wherein the intermediate layer includes a hole injection layer, a light-emitting layer, and an electron injection layer that are sequentially stacked,
a side surface of the first auxiliary electrode is positioned inward of a side surface of the second auxiliary electrode within at least one of the first opening, the second opening, and the third opening of the pixel defining layer to form an undercut shape, and
the hole injection layer of the intermediate layer includes:
a first portion disposed on a side surface of the pixel defining layer defining each opening of the pixel defining layer, and
a second portion disconnected from the first portion and disposed on the second auxiliary electrode.

14. The display device of claim 13, wherein the intermediate layer further includes:
a hole transport layer disposed between the hole injection layer and the light-emitting layer, and an electron transport layer disposed between the light-emitting layer and the electron injection layer, and the hole transport layer, the electron transport layer, and the electron injection layer each integrally extend and overlap the first pixel electrode, the second pixel electrode, and the third pixel electrode.

15. The display device of claim 14, wherein the light-emitting layer includes:

a first light-emitting layer overlapping the first pixel electrode, a second light-emitting layer overlapping the second pixel electrode, and a third light-emitting layer overlapping the third pixel electrode, and the first light-emitting layer, the second light-emitting layer, and the third light-emitting layer are disposed to be spaced apart from each other.

16. The display device of claim 15, wherein the first auxiliary electrode and the second auxiliary electrode are disposed on the first pixel electrode and the second pixel electrode and are not disposed on the third pixel electrode.

17. The display device of claim 16, wherein a third auxiliary electrode is disposed between the first auxiliary electrode disposed on the first pixel electrode and the first pixel electrode, a side surface of the third auxiliary electrode is positioned outward of the side surface of the first auxiliary electrode disposed on the first pixel electrode within the first opening of the pixel defining layer, and the first light-emitting layer emits red light.

18. The display device of claim 17, wherein the first auxiliary electrode disposed on the second pixel electrode is disposed directly above the second pixel electrode, and the second light-emitting layer emits green light.

19. The display device of claim 18, wherein the first portion of the hole injection layer disposed on the side surface of the pixel defining layer defining the third opening of the pixel defining layer integrally extends to cover a top surface of the third pixel electrode, and the third light-emitting layer emits blue light.

20. A manufacturing method of a display device, the manufacturing method comprising:

forming a pixel electrode on a substrate;

forming a pixel defining layer including an opening extending to a portion of the pixel electrode on the pixel electrode;

sequentially forming a first auxiliary electrode layer and a second auxiliary electrode layer disposed on the pixel defining layer and extending to cover the opening of the pixel defining layer;

forming a photoresist layer on a portion of the second auxiliary electrode layer overlapping the portion of the pixel electrode to which the opening of the pixel defining layer extends;

forming a second auxiliary electrode by etching a portion of the second auxiliary electrode layer that does not overlap the photoresist layer;

forming a first auxiliary electrode by etching a portion of the first auxiliary electrode layer that does not overlap the photoresist layer;

forming an undercut shape in which a side surface of the first auxiliary electrode is positioned inward of a side surface of the second auxiliary electrode within the opening of the pixel defining layer by etching the side surface of the first auxiliary electrode; and forming a hole injection layer including a first portion disposed on a side surface of the pixel defining layer defining the opening of the pixel defining layer and a second portion disconnected from the first portion and disposed on the second auxiliary electrode.

* * * * *